(12) United States Patent  
Yoshikawa et al.

(10) Patent No.: US 7,771,893 B2  
(45) Date of Patent: Aug. 10, 2010

(54) PHOTOMASK BLANK, PHOTOMASK AND FABRICATION METHOD THEREOF

(75) Inventors: Hiroki Yoshikawa, Niigata (JP); Hiroshi Kubota, Niigata (JP); Yoshinori Kinase, Niigata (JP); Satoshi Okazaki, Niigata (JP); Tamotsu Maruyama, Niigata (JP); Takashi Haraguchi, Tokyo (JP); Masahide Iwakata, Tokyo (JP); Yuichi Fukushima, Tokyo (JP); Tadashi Saga, Tokyo (JP)

(73) Assignees: Shin-Etsu Chemical Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 708 days.

(21) Appl. No.: 11/489,477

(22) Filed: Jul. 20, 2006

(65) Prior Publication Data

US 2007/0020534 A1   Jan. 25, 2007

(30) Foreign Application Priority Data

Jul. 21, 2005   (JP)   ............................. 2005-211941  
Jul. 21, 2005   (JP)   ............................. 2005-211942

(51) Int. Cl.  
*G03F 1/00*   (2006.01)

(52) U.S. Cl. ............................. 430/5; 430/311; 428/209

(58) Field of Classification Search ..................... 430/5, 430/311; 428/209  
See application file for complete search history.

(56) References Cited

U.S. PATENT DOCUMENTS 6,037,083 A    3/2000    Mitsui

2004/0229136 A1*    11/2004    Kaneko et al. .................. 430/5  
2005/0244722 A1*    11/2005    Okada et al. .................... 430/5

(Continued)

FOREIGN PATENT DOCUMENTS

EP   1152291 A2   11/2001

(Continued)

OTHER PUBLICATIONS

English Translation of JP 2003-322956A, Ushida et al., Nov. 2003.*

(Continued)

*Primary Examiner*—Mark F Huff  
*Assistant Examiner*—Rashid Alam  
(74) *Attorney, Agent, or Firm*—Finnegan, Henderson, Farabow, Garrett & Dunner LLP

(57) ABSTRACT

A light-shielding film for exposure light is formed on one principal plane of a transparent substrate made of quartz or the like that serves as a photomask substrate. The light-shielding film can serve not only as the so-called "light-shielding film" but also as an anti-reflection film. In addition, the light-shielding film has a total thickness of 100 nm or less, 70% or more of which is accounted for by the thickness of a chromium compound that has an optical density (OD) per unit thickness of 0.025 $nm^{-1}$ for light having a wavelength of 450 nm. In the case where the photomask blank is used for fabricating a mask designed for ArF exposure, the thickness and composition of the light-shielding film are selected in such a manner that the OD of the light-shielding film is 1.2 to 2.3 for 193 or 248 nm wavelength light.

20 Claims, 11 Drawing Sheets

Light-shielding film A

Light-shielding film B

U.S. PATENT DOCUMENTS

2008/0305406 A1   12/2008   Kominato et al.

FOREIGN PATENT DOCUMENTS

| EP | 1688789 A2 | 8/2006 |
|---|---|---|
| JP | 60182439 | 9/1985 |
| JP | 61198156 | 9/1986 |
| JP | 63-085553 | 4/1988 |
| JP | 2001-147516 | 5/2001 |
| JP | 2001-312043 | 11/2001 |
| JP | 2002-221801 | 8/2002 |
| JP | 2002-244274 | 8/2002 |
| JP | 3093632 | 2/2003 |
| JP | 2003-195479 | 7/2003 |
| JP | 2003-195483 | 7/2003 |
| JP | 2003322956 A * | 11/2003 |
| JP | 2004-039884 | 2/2004 |
| JP | 2004-109557 | 4/2004 |
| JP | 2004-144900 | 5/2004 |
| JP | 2004-205921 | 7/2004 |
| JP | 2004-251995 | 9/2004 |
| WO | WO 2006/006540 A1 | 1/2006 |

OTHER PUBLICATIONS

Extended Search Report from the European Patent Office for corresponding European application EP06013457 mailed Mar. 5, 2010 (8 pages).

Written Opinion from the Austrian Patent Office for corresponding application 200800546-4 mailed Feb. 3, 2010 (2 pages).

* cited by examiner

Light-shielding film A

Light-shielding film B

Light-shielding film C

Light-shielding film A

Light-shielding film D

Light-shielding film E

No.4　　　　No.5　　　　No.6　　　　Ref.2

PHOTOMASK BLANK, PHOTOMASK AND FABRICATION METHOD THEREOF

BACKGROUND OF THE INVENTION

1. Field of the Invention

The present invention relates to a photomask, a photomask blank, which is a raw material of the photomask, and fabrication methods thereof.

2. Description of the Related Art

In recent years, in order to meet the demand for miniaturization of circuit patterns required for increasing the packaging density of large-scale integrated circuits, advanced semiconductor micromachining techniques have become extremely important. For example, increasing the packaging density of a large-scale integrated circuit essentially requires a technique of thinning wires of wiring patterns in the circuit or a technique of miniaturizing a contact hole pattern for interlevel wiring of a cell. The trend toward miniaturization of circuit patterns of large-scale integrated circuits is being accelerated because it is the most effective approach to increase the operation speed thereof and reduce the power consumption thereof.

Most of such advanced micromachining techniques are based on the photolithography technique using a photomask. Therefore, the photomask, as well as the exposure apparatus and the resist material, is an essential technique for miniaturization. Therefore, in order to provide a photomask having a wiring pattern of thinned wires and a miniaturized contact hole pattern described above, development of a technique for forming a finer and more precise pattern on a photomask blank has been pursued.

To form a highly precise photomask pattern on a photomask substrate, it is essential that a resist pattern formed on a photomask blank is highly precise. When micromachining a semiconductor substrate, reduction projection photolithography is performed, and therefore, the size of the pattern formed on the photomask is about four times as large as the size of the pattern formed on the semiconductor substrate. However, this does not mean that the restriction on the precision of the pattern formed on the photomask is relaxed. On the contrary, the photomask pattern has to be formed with higher precision than the pattern provided on the semiconductor substrate after exposure.

Furthermore, at present, circuit patterns written on semiconductor substrates by photolithography are significantly small compared with wavelengths of exposure light. Thus, if reduction projection exposure is performed using a photomask that has a photomask pattern formed from a circuit pattern on a semiconductor substrate through 4-fold magnification is used to perform, the photomask pattern cannot be faithfully transferred onto the resist film due to interference of the exposure light or the like.

Thus, as a super-resolution mask, there are commonly used an OPC mask that corrects the optical proximity effect, which degrades the transfer characteristics, by the so-called optical proximity effect correction (OPC) and a phase-shift mask that makes the phases of adjacent aperture patterns different by 180° to make the optical amplitude at the middle of the adjacent aperture patterns zero. For example, the OPC mask has to have an OPC pattern (a hammer head, an assist bar or the like) that has a size one-half or less the size of the circuit pattern has to be formed. Besides, a half-tone phase-shift mask, which has a region transparent to the exposure light and a translucent region that has controlled transmittance and phase-shift capability, is known as a technique that provides a greatly improved resolution and widely used because it does not require significant modification of the mask design.

Typically, when forming a photomask pattern, a photoresist film is formed on a photomask blank having a light-shielding film on a transparent substrate, the photoresist film is irradiated with an electron beam to write a pattern thereon, and the photoresist film is developed to provide a resist pattern. Then, using the resist pattern as an etching mask for the light-shielding film, the light-shielding film is patterned to form a photomask pattern. In order to form a fine photomask pattern, it is important to make the photoresist film thin for the reason described below.

If the resist pattern is miniaturized without reducing the thickness of the resist film, the aspect ratio (that is, the ratio between the resist film thickness and the pattern width) of the part of the resist serving as the etching mask for the light-shielding film increases. In general, as the aspect ratio of the resist pattern increases, the pattern becomes more susceptible to degradation, and if the resist pattern is used as the etching mask, the precision of the transfer thereof onto the light-shielding film decreases. In an extreme case, a part of the resist pattern may fall or peel off, resulting in a defective pattern. Thus, as the photomask pattern becomes finer, the thickness of the resist film used as the etching mask for the light-shielding film has to be reduced to avoid an undesirably great aspect ratio. The aspect ratio is desirably equal to or less than 3. For example, when forming a resist pattern having a pattern width of 70 nm, the thickness of the resist is desirably equal to or less than 210 nm.

As for the material of the light-shielding film that is patterned using the photoresist as an etching mask, many materials have already been proposed. Among others, chrome-metal films and chromium-compound films can contain a large amount of information about etching, so that, in practical, such chromium compounds have been always used as the material of the light-shielding film, and forming the light-shielding film from the chromium compound has been substantially established as a standard process step. For example, in Japanese Patent Laid-Open Nos. 2003-195479 and 2003-195483 and Registered Japanese Utility Model No. 3093632, there have been disclosed exemplary structures of photomask blanks, which have a light-shielding film made of a chromium compound that has a light-shielding characteristic required for a photomask blank designed for ArF exposure.

In general, the light-shielding film made of a chromium compound is patterned by oxygen-and-chlorine-based dry etching. However, such etching often has a significant effect on an organic film, such as the photoresist. Thus, if the light-shielding film made of a chromium compound is etched using a relatively thin resist film as a mask, the resist is damaged during the etching, the configuration of the resist pattern changes, and it is difficult to accurately transfer the original resist pattern onto the light-shielding film.

However, it is technically difficult to make the photoresist, which is an organic film, have both high resolution and patterning precision and high etching resistance. As far as a conventional patterning process is used, there exists a tradeoff between the resolution and the etching resistance. Specifically, the photoresist film has to be made thinner to achieve higher resolution, while thinning of the photoresist film has to be limited to assure the etching resistance during the patterning step.

Thus, in order to form a highly precise photomask pattern while reducing the burden on a photoresist to reduce the thickness thereof, it is necessary to optimize the structure (including thickness and composition) of the light-shielding film to be patterned.

As for the material of the light-shielding film, many investigations have already been made. For example, in Japanese Patent Laid-Open No. 2001-312043, there is reported an example in which a tantalum metal film is used as a light-shielding film for ArF exposure. In this example, a tantalum metal film is used as a light-shielding film, a tantalum oxide film is used as an antireflection layer, and the two layers are etched using a fluorine-based gas plasma, which is relatively unlikely to damage a photoresist, in order to reduce the burden on the photoresist during etching.

However, even if such an etching condition is selected, as far as the two layers, the light-shielding film and the antireflection layer, are etched using only the photoresist as a mask, reduction of the burden on the photoresist is limited, and it is difficult to sufficiently satisfy the demand for highly precise formation of a fine photomask pattern.

Alternatively, there has been known a technique of reducing the burden on the photoresist during dry etching by using a hard mask. For example, in Japanese Patent Laid-Open No. 63-85553, there is disclosed a technique of dry-etching a metal silicide film using a $SiO_2$ film formed on the metal silicide film as an etching mask.

However, the $SiO_2$ film has a poor conductivity, so that a problem of charge-up tends to occur during exposure to an electron beam. Furthermore, defect inspection of the photomask blank is typically based on the reflectance thereof, and light having a wavelength of 257 nm is used for the defect inspection of a mask for ArF-exposure. In order to accurately achieve the defect inspection, the reflectance for the light of that wavelength has to fall within a range of about 10 to 20%. However, if the $SiO_2$ film is used as an etching mask, there occurs a problem that the $SiO_2$ film has an excessively high reflectance, which interferes with the defect inspection.

As described above, conventional photomask blank structures cannot satisfactorily meet the demand for highly precise formation of a fine photomask pattern on the light-shielding film. This problem is particularly serious in the case of a photomask for photolithography using exposure light having a short wavelength of 250 nm or less for which high resolution is required (KrF: 248 nm, ArF: 193 nm, $F_2$: 157 nm). Thus, as the wavelength of the exposure light becomes shorter, the design of the light-shielding film for forming a highly precise photomask pattern that can reduce the burden on the photoresist becomes more important.

SUMMARY OF THE INVENTION

The present invention has been devised in view of such problems, and an object thereof is to provide a photomask blank that has a light-shielding film having a configuration that allows highly precise formation of a fine photomask pattern through reduction in thickness of a photoresist used as a mask for forming the photomask pattern, and a photomask fabricated using the same photomask blank.

In order to attain the object described above, a photomask blank according to the present invention has features described below.

A photomask blank according to the present invention is a photomask blank comprising: a transparent substrate; and a light-shielding film for exposure light formed on the transparent substrate, characterized in that the light-shielding film has a total thickness of 100 nm or less, 70% or more of which is accounted for by the thickness of a chromium compound that has an optical density (OD) per unit thickness of 0.025 $nm^{-1}$ or less for light having a wavelength of 450 nm.

Preferably, the total thickness of the light-shielding film is equal to or less than 80 nm.

In addition, preferably, the optical density (OD) of the light-shielding film is 2.5 to 3.5 for light having a wavelength of 193 nm and/or 2.5 to 3.5 for light having a wavelength of 248 nm.

The light-shielding film may be a multilayer film that contains a stack of a plurality of layers, and the uppermost layer of the multilayer film preferably has a thickness of 10 to 40 nm.

The photomask blank according to the present invention has a light-shielding film having a thickness of 100 nm or less that has a high etching rate and a low metal percentage content. Thus, if a thin photoresist film (for example, a chemically amplified photoresist film having a thickness of 250 nm or less) is formed by application and used as a mask, the damage occurring during etching is substantially reduced.

As described above, the photomask blank according to the present invention achieves an increased dry-etching rate by adapting the thickness and composition of each layer to provide a desired optical characteristic and by providing a light-shielding film having a low metal percentage content. Therefore, the load on the photoresist, which is used as a mask for forming a photomask pattern, during dry etching is reduced, a practically acceptable level of etching resistance is assured, and thus, the thickness of the photoresist film can be reduced. That is, according to the present invention, reduction in thickness of the photoresist film, which is required for forming a fine photomask pattern with high precision, is achieved.

A photomask blank according to the present invention may be formed as a phase-shift mask blank, which is a half-tone phase-shift mask blank comprising: a transparent substrate; a translucent film having a predetermined phase-shift capability and a predetermined transmittance for exposure light formed on the transparent substrate; and a light-shielding film formed on the translucent film, characterized in that the translucent film has a region that contains both silicon (Si) and molybdenum (Mo), and the light-shielding film has a thickness of 60 nm or less.

Preferably, the thickness of the light-shielding film is equal to or less than 50 nm. More preferably, 70% or more the total thickness of the light-shielding film is accounted for by the thickness of a chromium compound that has an optical density (OD) per unit thickness of 0.025 $nm^{-1}$ or less for light having a wavelength of 450 nm.

The translucent film may be a multilayer film, and at least one layer of the multilayer film is preferably a layer that contains both silicon and molybdenum.

In addition, preferably, the optical density (OD) of the light-shielding film is 1.2 to 2.3 for light having a wavelength of 193 nm and/or 1.2 to 2.3 for light having a wavelength of 248 nm.

Preferably, the light-shielding film is a multilayer film that contains a stack of a plurality of layers, and the uppermost layer of the multilayer film has a thickness of 10 to 30 nm.

Preferably, 70% or more of the total thickness of the light-shielding film formed in the photomask blank according to the present invention is accounted for by the thickness of a chromium compound that has a chromium content of 50 atomic % or less in terms of atomic ratio.

In addition, the light-shielding film may comprise a chromium-metal film having a chromium content of 50 atomic % or more in terms of atomic ratio and a first and a second chromium-compound film having a chromium content of 50 atomic % or less in terms of atomic ratio, and the chromium-metal film may be disposed between the first chromium-compound film and the second chromium-compound film.

In addition, the light-shielding film may comprise a first and a second chromium-metal film having a chromium content of 50 atomic % or more in terms of atomic ratio and a first, a second and a third chromium-compound film having a chromium content of 50 atomic % or less in terms of atomic ratio, and the first chromium-metal film may be disposed between the first chromium-compound film and the second chromium-compound film, and the second chromium-metal film may be disposed between the second chromium-compound film and the third chromium-compound film.

Preferably, the second chromium-compound film has a thickness of 3 to 30 nm.

In addition, the light-shielding film preferably has a reflectance of 30% or less for light having a wavelength of 250 nm to 270 nm, and the light-shielding film may have an antireflection capability.

The light-shielding film may be a multilayer film that contains a stack of a plurality of layers having different optical characteristics, and the uppermost layer of the multilayer film preferably has an extinction coefficient (k) of 1.0 to 1.5 for light having a wavelength of 193 nm.

Preferably, a primary constituent material of the uppermost layer of the multilayer film is chromium oxide, chromium nitride or chromium oxynitride, and the percentage contents (atomic %) of oxygen, nitrogen and carbon in the film at depths of 0.5 to 1.0 nm from the surface of the uppermost layer are related according to the oxygen content>nitrogen content>carbon content.

The phase-shift mask blank according to the present invention has a light-shielding film having a thickness of 60 nm or less that has a high etching rate and a low metal percentage content and is formed on the translucent film containing both silicon and molybdenum. Thus, if a thin photoresist film (for example, a chemically amplified photoresist film having a thickness of 250 nm or less) is formed by application and used as a mask, the damage occurring during etching is substantially reduced.

As described above, the phase-shift mask blank according to the present invention achieves an increased dry-etching rate by adapting the thickness and composition of each layer to provide a desired optical characteristic and by providing a light-shielding film having a low metal percentage content. Therefore, the load on the photoresist, which is used as a mask for forming a photomask pattern, during dry etching is reduced, a practically acceptable level of etching resistance is assured, and thus, the thickness of the photoresist film can be reduced. That is, according to the present invention, reduction in thickness of the photoresist film, which is required for forming a fine photomask pattern with high precision, is achieved.

According to the present invention, the dry-etching rate is increased by reducing the chromium content (increasing the light element content) of the light-shielding film of the photomask blank compared with a conventional chromium-based light-shielding film, and the thickness and stack structure thereof is adapted to provide a desired optical characteristic. Therefore, the load on the photoresist, which is used as a mask for forming a photomask pattern, during dry etching is reduced, a practically acceptable level of etching resistance is assured, and thus, the thickness of the photoresist film can be reduced.

In particular, in order to reduce the thickness and assure a sufficient light-shielding effect, the light-shielding film according to the present invention has a structure including a stack of a light-element-rich and chromium-poor film and a thin chromium-metal film. Thus, the thin chromium-metal film can enhance the light-shielding effect, reduce the stress exerting between the stacked films, and provide a sufficient conductivity.

That is, according to the present invention, there can be provided a photomask blank that satisfies all of a plurality of requirements including control of the optical characteristic to provide desired transmittance T and reflectance R, stress reduction during film deposition, and control of the conductivity of the light-shielding film and allows formation of a fine photomask pattern on the light-shielding film with high precision.

DETAILED DESCRIPTION OF THE INVENTION

Figure 1A:
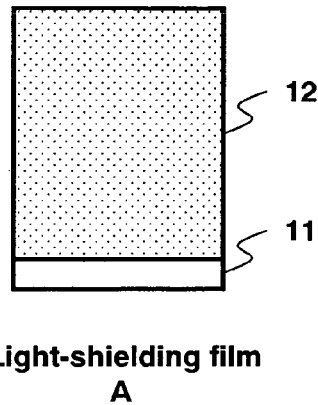
FIGS. 1A to 1C are schematic cross-sectional views for illustrating exemplary structures of light-shielding films formed in a photomask blank according to the present invention.

In the following, best modes for carrying out the present invention will be described with reference to the drawings.

EXAMPLE 1

Light-shielding Film of Photomask Blank According to Present Invention

In order to enable reduction of the thickness of a photoresist used as a mask for forming a photomask pattern, damage to the photo resist during etching of the light-shielding film that is patterned using the photoresist mask has to be reduced. To this end, it is essential to reduce the time required for etching of the light-shielding film by reducing the physical thickness of the light-shielding film to be patterned and/or by increasing the etching rate of the light-shielding film.

Investigations by the inventors have proven that the etching rate of the light-shielding film can be achieved by reducing the metal percentage content of the film. This means that high-rate etching can be achieved by designing a chromium-based light-shielding film, which is commonly used, to reduce the chromium content (percentage content) of the film.

For example, in the case where a light-shielding film of a chromium compound is dry-etched using chlorine gas containing oxygen (a gas mixture of $Cl_2$ gas and $O_2$ gas), the etching rate increases as the chromium percentage content (atomic %) of the light-shielding film decreases. Therefore, by reducing the chromium percentage content of the film while increasing the percentage content of a light element, high-rate etching of the light-shielding film can be achieved, and the burden on the photoresist mask can be reduced.

However, if the light-element percentage content of the chromium-compound film is increased while reducing the chromium percentage content thereof, the extinction coefficient k is reduced at longer wavelengths, and as a result, the transmittance T is increases, and the light-shielding effect is reduced. Thus, if the chromium percentage content of the film is simply reduced, the thickness of the film has to be increased in order to assure an adequate light-shielding effect as the light-shielding film, and thus, it is difficult to attain the original purpose, that is, reduction of the etching time. In other words, there is a trade-off between increase of the etching rate and reduction of the film thickness.

In addition, as described earlier, a photomask blank is subjected to defect inspection before patterning. The defect inspection is typically based on the reflectance of light of an inspection wavelength, and thus, the optical characteristic of the light-shielding film has to be designed so that the reflectance thereof is neither excessively high nor low and falls within an adequate range in order to achieve the defect inspection with high precision. That is, control of the reflectance of the light-shielding film is an important factor for achieving the defect inspection of the photomask blank with high precision.

As described above, in designing the light-shielding film of the photomask blank that allows reduction of the thickness of the photoresist mask, the chromium percentage content of the chromium-based light-shielding film is reduced while increasing the percentage content of a light element in order to increase the rate of dry etching, and the composition of the chromium compound and the thickness d of the light-shielding film have to be selected so that the light-shielding film has desired extinction coefficient k (transmittance T) and reflectance R as an optical film. In addition, in the case where the light-shielding film is composed of a plurality of layers, the light-shielding film has to have an adequate multilayer structure.

Furthermore, from the technical view point of the deposition process for forming the photomask blank by stacking a plurality of layers, strain (stress) exerted between the stacked layers has to be sufficiently reduced, and the photomask blank has to have a predetermined range of conductivity required when the resulting photomask is used.

That is, in order to accurately form a photomask having a fine pattern on the light-shielding film, a plurality of requirements including control of the optical characteristic to provide desired transmittance T and reflectance R, stress reduction during film deposition, and control of the conductivity of the light-shielding film have to be satisfied at the same time.

Thus, the light-shielding film of the photomask blank made of a chromium compound according to the present invention has a composition richer in a light element and poorer in chromium than the conventional film in order to increase the speed of dry etching, and the composition, thickness and stack structure of the light-shielding film are appropriately designed to provide desired transmittance T and reflectance R.

The light-shielding film of the photomask blank according to the present invention has a stack structure including a film having a light-element-rich and chromium-poor composition and a thin film of a chromium metal in order to reduce the thickness thereof and to ensure sufficient light-shielding effect. The thin chromium metal film can not only increase the light-shielding effect but also reduce the stress exerting between the stacked films and increase the conductivity. Thus, the resulting photomask blank can satisfy the plurality of requirements including control of the optical characteristic to provide desired transmittance T and reflectance R, stress reduction during film deposition, and control of the conductivity of the light-shielding film at the same time.

As described above, the light-shielding film of the photomask blank according to the present invention has a stack structure including a film having a light-element-rich and chromium-poor composition and a thin chromium-metal film. In the following, however, characteristics of the film having a light-element-rich and chromium-poor composition, which is essential in the present invention, will be first described.

Figure 1B:
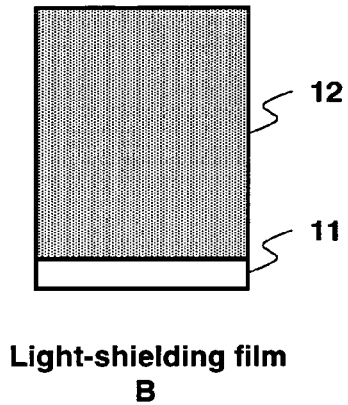
Figure 1C:
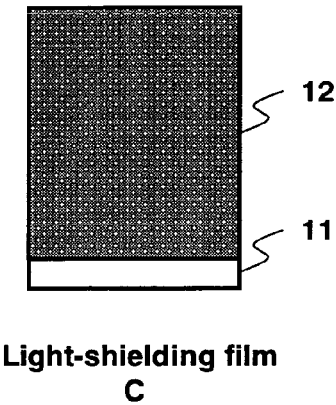
Figure 1D:
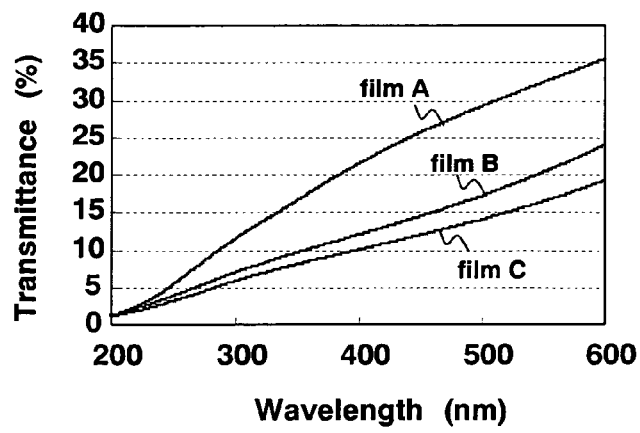
FIG. 1D is a graph for illustrating the dependency of the optical characteristic (transmittance) of the light-shielding films shown in FIGS. 1A to 1C on the composition (chromium percentage content) thereof.

FIGS. 1A to 1C are schematic cross-sectional views for illustrating exemplary structures of light-shielding films formed in a photomask blank according to the present invention, and FIG. 1D is a graph for illustrating the dependency of the optical characteristic (transmittance) of those light-shielding films on the composition (chromium percentage content) thereof. The three light-shielding films (A, B and C)

illustrated in the drawings are all chromium oxynitride films (CrON films) 12 primarily containing chromium formed on one principal plane of an optically transparent quartz substrate 11 and differ in chromium percentage content and oxygen percentage content. Specifically, the light-shielding film A contains 41 atomic % of Cr, 46 atomic % of O, and 13 atomic % of N. The light-shielding film B contains 43 atomic % of Cr, 37 atomic % of O, and 20 atomic % of N. The light-shielding film C contains 45 atomic % of Cr, 31 atomic % of O, and 24 atomic % of N.

These chromium oxynitride films all have a thickness about 47 nm. Furthermore, the substrate 11 may be a common transparent substrate of $CF_2$ or aluminosilicate glass, rather than quartz.

The chromium percentage content is determined by electron spectrum for chemical analysis (ESCA) and is an average value of the chromium content of the light-shielding film for the entire thickness of the film. The chromium content of a typically chromium-based light-shielding film is about 55 to 70 atomic %. However, the chromium content of the light-shielding film according to the present invention is equal to or less than 50 atomic %. In this way, the amount of chromium is significantly reduced.

In this specification, the light-shielding film having a chromium percentage content of 50 atomic % or more may be referred to as "metal film". For example, the light-shielding film according to the present invention is designed in such a manner that the thickness of the chromium compound film having a chromium content of 50 atomic % or less accounts for 70% or more of the total thickness of the light-shielding film. Alternatively, the light-shielding film may be designed in such a manner that the thickness of the chromium compound film having an optical density OD of 0.03 ($nm^{-1}$) or less per unit film thickness for light having a wavelength of 450 nm accounts for 70% or more of the total thickness of the light-shielding film. Here, the "optical density per unit film thickness" means the OD of the light-shielding film (dimensionless) divided by the thickness of the light-shielding film (nm).

FIG. 1D is a graph for illustrating the wavelength dependency of the transmittance of the light-shielding films A, B and C. From the results shown in this drawing, it can be seen that changing the chromium percentage content of the light-shielding film can change the transmittance (and reflectance) thereof. In particular, the transmittance to light of a wavelength shorter than 248 nm, which is a wavelength used for KrF exposure, can be substantially kept constant while changing the transmittance (and reflectance) for light of a wavelength longer than 248 nm.

Figure 2:
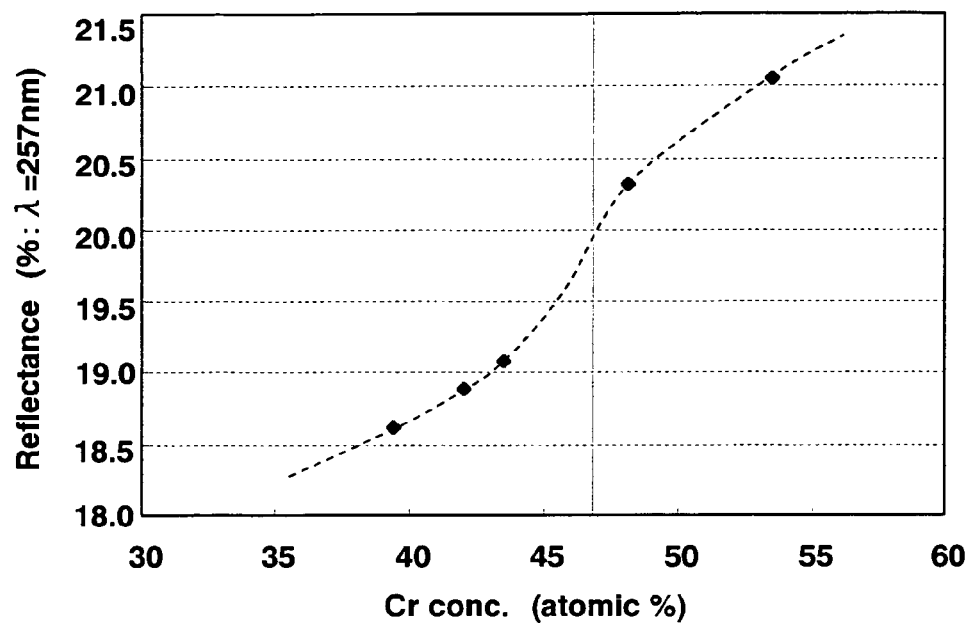
FIG. 2 is a graph for illustrating the dependency of the reflectance for light having a wavelength of 257 nm, which is used for defect inspection of the photomask blank, on the chromium percentage content of the light-shielding film.

FIG. 2 is a graph for illustrating the reflectance of light of a wavelength of 257 nm, which is used for defect inspection of the photomask blank, on the chromium percentage content of the film. As shown in this drawing, the light-shielding film having a chromium percentage content of 47 atomic % or less has a reflectance of about 10 to 20%. Thus, it can be seen that, in order to achieve defect inspection with high precision, the chromium percentage content of the light-shielding film is preferably designed to be equal to or less than 47 atomic %.

The chromium percentage content can be controlled by the amount of reactive gas introduced for sputtering, and the lower limit thereof depends on the kind of the reactive gas. For example, if the reactive gas is oxygen, supposing that the number of charges of chromium is +3, the stoichiometric amount is 40 atomic %, and the theoretical lower limit is 40 atomic %. However, the actual measurement of the chromium percentage content may be reduced to about 35 atomic %. It can be considered that the percentage content is lower than the lower limit of the stoichiometric amount in this way because the number of charges of chromium can be a value other than +3.

Figure 3:
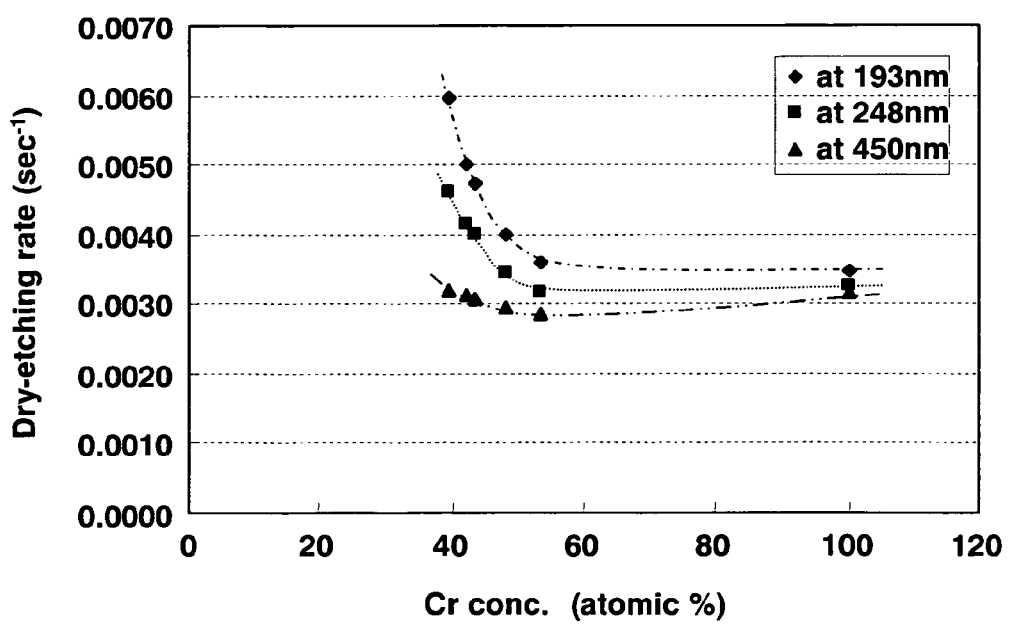
FIG. 3 is a graph for illustrating the dependency, on the chromium percentage content, of the dry-etching rate determined based on the clear time in the case where the light-shielding film is etched by oxygen-and-chlorine-based dry etching.

FIG. 3 is a graph for illustrating the dependency, on the chromium percentage content, of the dry-etching rate determined based on the clear time in the case where the light-shielding film described above is etched by oxygen-and-chlorine-based dry etching. It is to be noted that the dry-etching rate shown in this drawing is represented in terms of OD. The adequate thickness of the chromium film to provide a required level of light-shielding effect depends on the composition and layered structure thereof. On the other hand, the light-shielding effect of chromium is required as a masking capability.

Thus, in order to estimate the time required to remove the chromium film formed so that a required light-shielding effect is achieved by dry etching, the dry-etching rate in terms of OD is defined as described below. The dry-etching rate in terms of OD is defined as the OD of the chromium film divided by the dry-etching time (that is, [the dry-etching rate in terms of OD]=[OD of the chromium film/dry-etching time ($sec^{-1}$)]).

As is apparent from FIG. 3, the etching rate of the light-shielding film having a Cr percentage content of 52 to 100 atomic % is about 0.0035 $sec^{-1}$, and the etching rate in terms of OD abruptly increases once the Cr percentage content becomes equal to or lower than about 50 atomic %. This effect is more remarkable for shorter wavelengths and is sufficiently achieved for a wavelength equal to or shorter than 248 nm.

Conventional chromium light-shielding films are designed for light having passed through a blue filter (having a wavelength of 450 nm). In this case, it is difficult to improve the etching rate in terms of OD by adjusting the Cr content. However, in the case of the chromium light-shielding film designed only for light of a short wavelength equal to or less than 248 nm, the dry-etching rate in terms of OD can be improved by appropriately adjusting the chromium content. In this way, the dry-etching speed can be increased by reducing the amount of chromium in the chromium-based light-shielding film to provide a light-element-rich film, and thus, high speed etching can be performed.

In designing the photomask blank, the composition of the light-shielding film is determined by comprehensively taking into account the optical characteristics (including the extinction coefficient k and the refractive index n) thereof that make the etching speed, the total thickness of the light-shielding film, and the reflectance and transmittance to light having a predetermined wavelength fall within their respective adequate ranges. However, according to the present invention, the light-shielding film is designed that has no metal region (metal film) that primarily causes reduction of the etching rate of the light-shielding film or has an extremely thin metal film used only as a transmittance adjustment layer.

As described above, the light-shielding film according to the present invention is made of a compound of chromium and a light element. The compound may be chromium oxide (CrO), chromium nitride (CrN), chromium oxycarbide (CrOC), chromium nitride carbide (CrNC) and chromium oxynitride carbide (CrONC), rather than chromium oxynitride (CrON). In terms of ease of film deposition and controllability of optical characteristics, it is preferable that the nitrogen content falls within a range of 0 to 50 atomic %, the oxygen content falls within a range of 10 to 60 atomic %, and the carbon content falls within a range of 0 to 40 atomic %.

The light-shielding film of the photomask blank according to the present invention can be composed of a single layer having a low chromium percentage content as shown in FIGS.

1A to 1C or composed of a stack of a plurality of layers having different chromium percentage contents.

Figure 4A:
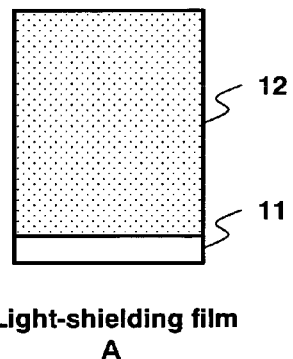
FIGS. 4A to 4C are schematic cross-sectional views for illustrating exemplary structures of light-shielding films formed in the photomask blank according to the present invention.
Figure 4B:
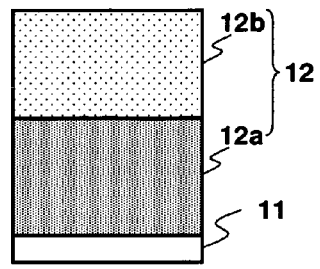
Figure 4C:
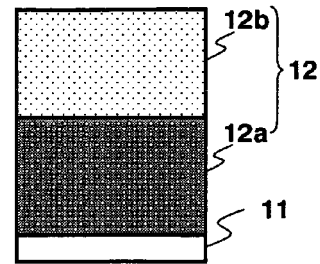

FIGS. 4B and 4C are diagrams for illustrating variations of the optical characteristic of the light-shielding film composed of a stack of layers having different chromium percentage contents (a relatively-chromium-rich layer and a relatively-chromium-poor layer). A light-shielding film A is composed of a single layer having a thickness of 47 nm and contains 41 atomic % of Cr, 46 atomic % of O and 13 atomic % of N (already shown in FIGS. 1A to 1C). Light-shielding films D and E are both light-shielding films composed of a stack of two layers having different chromium contents (12a and 12b). The light-shielding film shown in FIG. 4A is the same as the light-shielding film A shown in FIG. 1A.

The light-shielding film D shown in FIG. 4B has a total thickness of 47 nm and is composed of the upper layer 12b having a thickness of 20 nm and containing 41 atomic % of Cr, 46 atomic % of O and 13 atomic % of N and the lower layer 12a having a thickness of 27 nm and containing 43 atomic % of Cr, 37 atomic % of O and 20 atomic % of N. The light-shielding film E shown in FIG. 4C has a total thickness of 47 nm and is composed of the upper layer 12b having a thickness of 20 nm and containing 41 atomic % of Cr, 46 atomic % of O and 13 atomic % of N and the lower layer 12a having a thickness of 27 nm and containing 45 atomic % of Cr, 31 atomic % of O and 24 atomic % of N. That is, the upper layers 12b of the light-shielding films D and E have the same composition as the light-shielding film A, but the lower layers 12a thereof have compositions different from their respective upper layers.

Here, the chromium-rich layer and the chromium-poor layer are constituted by films primarily made of chromium oxide, chromium nitride, chromium oxynitride, chromium oxycarbide, chromium nitride carbide or chromium oxynitride carbide.

FIGS. 4B and 4C show stack structures composed of two layers for illustrative purposes. However, of course, the light-shielding film can be composed of a stack of three or more films having different chromium percentage contents. Furthermore, the stack structure may contain a thin metal film that serves as a transmittance adjustment layer.

Figure 4D:
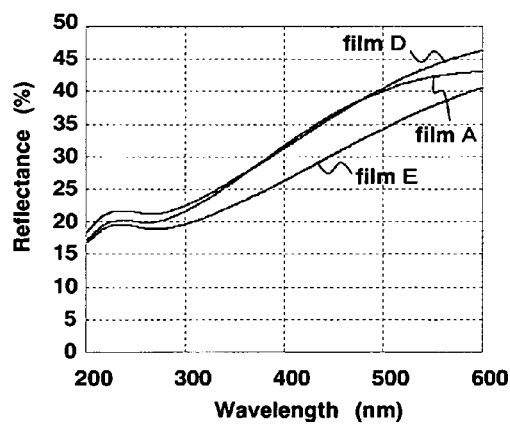
FIG. 4D is a graph for illustrating the wavelength dependency of the reflectance of the light-shielding films shown in FIGS. 4A to 4C.
Figure 4E:
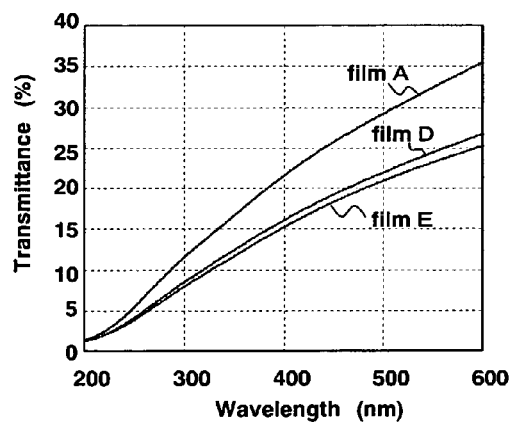
FIG. 4E is a graph for illustrating the wavelength dependency of the transmittance of the light-shielding films shown in FIGS. 4A to 4C.

As shown in FIGS. 4D and 4E, these films have substantially equal transmittances (T) of about 2% to light having a wavelength in the vicinity of approximately 200 nm (specifically 193 nm), which is used for ArF exposure. However, the transmittance (T) and the reflectance (R) to light of longer wavelengths significantly vary with the structure of the light-shielding film. The stack structure of the light-shielding film has an advantage that the design flexibility is substantially increased compared with the light-shielding film composed of a single layer having equivalent optical characteristics because the light-shielding film can be designed using the compositions and thicknesses of the upper and lower layers as parameters.

Comparing the reflectance and transmittance between the light-shielding films D and E, there is no remarkable difference in transmittance between these films in a wavelength range of 200 to 600 nm, the wavelength dependency of the reflectance in this wavelength range significantly differ between the films. The reflectance of the light-shielding film E is about 5% lower than the reflectance of the light-shielding film D. The optical characteristics behave in this way because the reflectance depends on the optical reflectance property at the interface between the upper and lower layers of the light-shielding film, that is, the difference (Δn) in refractive index n between the layers, while the transmittance is substantially determined by the chromium content of the light-shielding film. In other words, a light-shielding film having a desired reflectance can be provided by appropriately selecting the difference in chromium content between the chromium-rich layer and the chromium-poor layer. From the viewpoint of the photomask blank design and the film deposition process, the difference in refractive index Δn can be readily controlled if the difference in chromium content between the layers is equal to or greater than 5 atomic %.

In addition, the chromium-poor layer having a relatively low chromium percentage content formed as the uppermost layer as in the exemplary light-shielding films shown in FIGS. 4B and 4C is intended to assure the anti-reflection effect of the light-shielding film. That is, the chromium-poor layer formed as the uppermost layer of the light-shielding film serves as an anti-reflection layer, so that the light-shielding film can have a low reflectance. On the other hand, if the chromium-poor layer is located on the side of the substrate, the in-plane uniformity of dry etching can be advantageously readily assured.

The composition and stack structure of such a light-shielding film are appropriately selected so that the photomask blank fabricated has a required optical characteristic. Preferably, the light-shielding film is designed so that the transmittance to exposure light is equal to or higher than 0.01% and equal to or lower than 5%, and the reflectance to light having a wavelength from 250 nm to 270 nm is equal to or higher than 10% and equal to or lower than 20%. In order to assure high patterning precision, the physical film thickness is preferably small. The total thickness of the light-shielding film is preferably equal to or less than 100 nm, and more preferably, equal to or less than 80 nm.

Figure 5A:
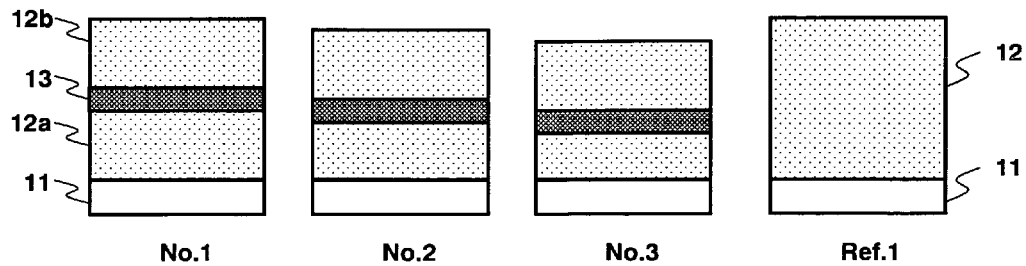
FIG. 5A includes schematic cross-sectional views for illustrating various stack structures of light-shielding films that the photomask blank according to the present invention can have.
Figure 5B:
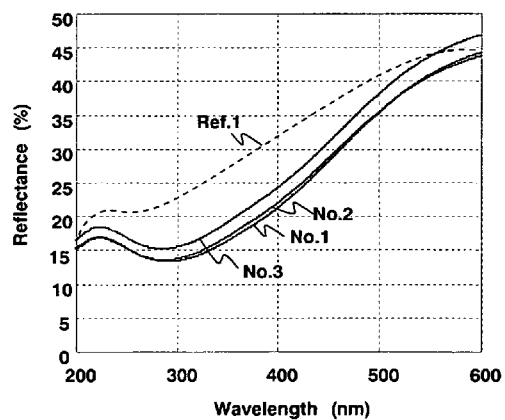
FIG. 5B is a graph for illustrating the wavelength dependency of the reflectance of the light-shielding films shown in FIG. 5A.
Figure 5C:
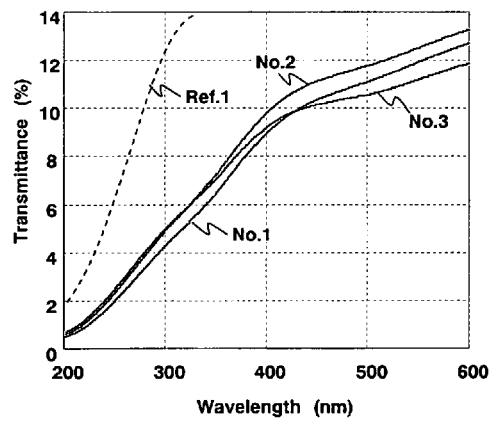
FIG. 5C is a graph for illustrating the wavelength dependency of the transmittance of the light-shielding films shown in FIG. 5A.

FIGS. 5A to 5C are diagrams for illustrating exemplary optical characteristics of light-shielding film of the photomask blank according to the present invention. FIG. 5A is a schematic cross-sectional view for illustrating various stack structures of light-shielding films, Nos. 1, 2, 3 and Reference 1. FIGS. 5B and 5C are graphs showing reflectance characteristics and transmittance characteristics of the light-shielding films, respectively.

Light-shielding films Nos. 1, 2 and 3 comprise a substrate 11, and a first light-element-rich and chromium-poor film 12a, a thin chromium-metal film 13 and a second light-element-rich and chromium-poor film 12b stacked on the substrate 11. It is to be noted that the structures of the light-shielding films Nos. 1, 2 and 3 differ from each other only in thickness of the first light-element-rich and chromium-poor film 12a located on the side of the substrate 11 (the film deposition times are 240 sec, 230 sec, and 200 sec, respectively) and are substantially equal to each other in thickness of the second light-element-rich and chromium-poor film 12 located on the side of the surface (the film deposition time is 240 sec) and in thickness of the chromium-metal film 13 (the film deposition film is 66 sec). Here, a reference sample (Ref. 1) is a light-shielding film composed only of a light-element-rich and chromium-poor film 12 (the thickness expressed in terms of film deposition time is 540 sec). The light-element-rich and chromium-poor films shown in these drawings are chromium oxynitride films (CrON films), as with the films described above with reference to FIGS. 1A to 1C.

As shown in FIG. 5C, compared with the conventional chromium-based light-shielding film, the chromium percentage content of the light-shielding film (Ref. 1) composed only of the light-element-rich and chromium-poor film 12 is significantly reduced, and the extinction coefficient k thereof is reduced accordingly. As a result, the light-shielding film has an increased transmittance T and a reduced light-shielding effect. Therefore, in order to assure that such a light-elementrich and chromium-poor film 12 has a sufficient light-shielding effect, the thickness thereof has to be increased.

To the contrary, if the light-element-rich and chromium-poor films 12a and 12b and the thin chromium-metal film 13 are stacked as in the case of the light-shielding films Nos. 1 to 3, a sufficient light-shielding effect can be achieved because of the thin chromium-metal film 13. That is, the thin chromium-metal film 13 can be used as a transmittance adjustment layer for the light-shielding film.

In addition, as can be seen from the results shown in FIG. 5B, by stacking the light-element-rich and chromium-poor films 12a and 12b and the thin chromium-metal film 13, the reflectance of the light-shielding film can be reduced. This means that the light-shielding film according to the present invention that comprises the stack of the light-element-rich and chromium-poor film 12 and the thin chromium-metal film 13 has a reduced reflectance that allows highly precise defect inspection and can be flexibly designed to have a required light-shielding effect.

If a light-shielding film is composed of a stack of a light-element-rich and chromium-poor film 12 and a thin chromium-metal film 13 as in the present invention, not only the advantage in the optical characteristics design described above can be provided, but also stress reduction in the stack film and conductivity improvement of the stack film can be achieved. Among others, the stress reduction of the stack film is an effect described below. A combination of a chromium-rich layer (a metal film) and a chromium-poor layer allows control of the stress in the light-shielding film. Typically, a tensile stress occurs in the chromium-rich layer, and a compressive stress occurs in the chromium-poor layer. Thus, an appropriate combination of the chromium-rich layer and the chromium-poor layer can make the stress in the entire light-shielding film approach zero. For example, if the chromium-poor layer has a thickness of 30 to 45 nm, and the chromium-rich layer has a thickness of 5 to 20 nm, the stress in the light-shielding film can be sufficiently reduced.

In addition, generally, the light-shielding film is required to have a conductivity of about 1 kΩ/sq, and a practically sufficient level of conductivity can be achieved by incorporating the thin chromium-metal film in the light-shielding film. For example, while the light-shielding film of the reference sample (Ref. 1) composed of a single layer has a sheet resistance of about $5*10^6$ Ω/sq, the light-shielding film having the structure No.1 shown in FIG. 5A can have a low sheet resistance of about 100 Ω/sq.

Figure 6A:
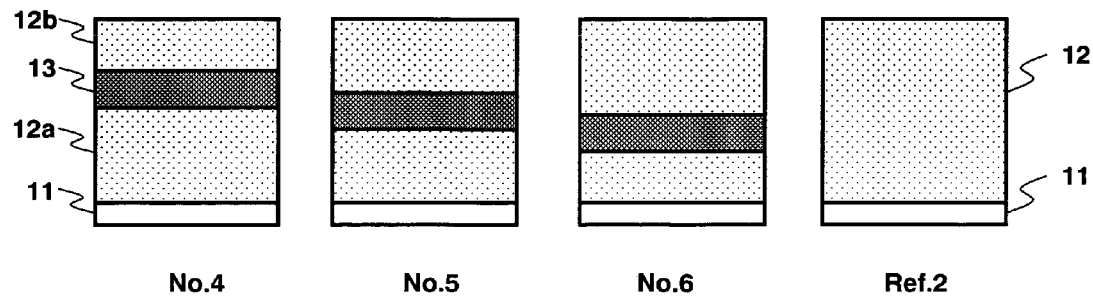
FIG. 6A includes schematic cross-sectional views for illustrating various stack structures of light-shielding films that differ in position of a chromium-metal film therein.
Figure 6B:
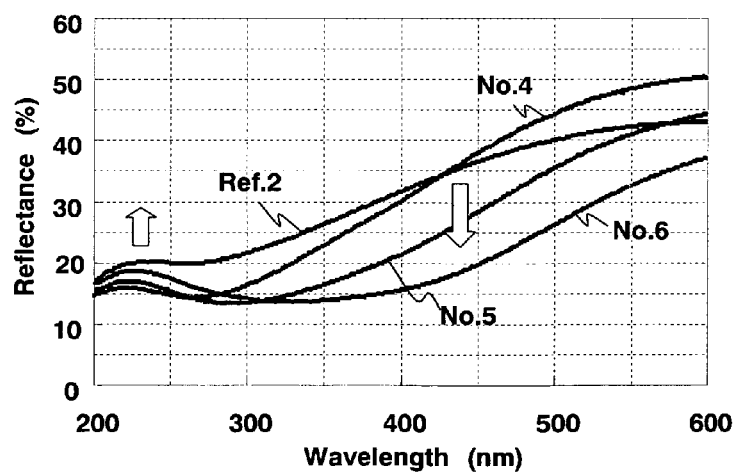
FIG. 6B is a graph for illustrating the reflectance characteristics of the light-shielding films shown in FIG. 6A.

FIGS. 6A and 6B are diagrams for illustrating a relationship between the position of a chromium-metal film serving as a transmittance adjustment layer in a light-shielding film and the reflectance of the light-shielding film. FIG. 6A includes schematic cross-sectional views for illustrating various stack structures of light-shielding films, Nos. 4 to 6 and reference 2, that differ in position of the chromium-metal film, and FIG. 6B shows reflectance characteristics of the light-shielding films. For comparison, the reflectance of a light-shielding film (Ref. 2) composed only of a light-element-rich and chromium-poor film is also shown.

The light-element-rich and chromium-poor films shown in these drawings are chromium oxynitride films (CrON films) as with the films described above with reference to FIGS. 5A to 5C. The structures of the light-shielding films Nos. 4, 5 and 6 differ from each other in thickness of the first light-element-rich and chromium-poor film 12a located on the side of the substrate 11 (the film deposition times are 250 sec. 200 sec, and 150 sec, respectively) and in thickness of the second light-element-rich and chromium-poor film 12b located on the side of the surface (the film deposition times are 150 sec, 200 sec, and 250 sec, respectively) and are substantially equal to each other in thickness of the chromium-metal film (the film deposition film is 100 sec). It is to be noted that the light-shielding films No. 4 to 6 and the reference sample (Ref. 2) are formed to have a substantially equal total thickness (the film deposition time is 500 sec).

As shown in FIG. 6B, the reflectance of the light-shielding film varies with the position of the chromium-metal film 13 and tends to decrease as the position of the chromium-metal film 13 is closer to the substrate 11. This is due to interference of light.

The wavelength at which the light-shielding film has the lowest reflectance depends on the optical distance of the light-element-rich and chromium-poor film 12b (the optical distance is proportional to the film thickness). For example, as the light-element-rich and chromium-poor film 12b becomes thicker (the film No. 6), the wavelength at which the lowest reflectance is achieved becomes longer. To the contrary, as the light-element-rich and chromium-poor film 12b becomes thinner (the film No. 4), the wavelength at which the lowest reflectance is achieved becomes shorter. In this way, any reflectance characteristic can be obtained by adjusting the thickness of the light-element-rich and chromium-poor film 12b.

Figure 7A:
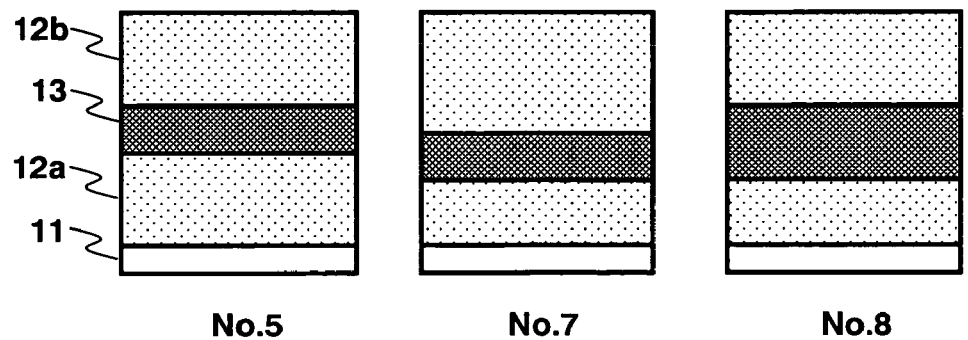
FIG. 7A includes schematic cross-sectional views for illustrating stack structures of light-shielding films having a light-element-rich and chromium-poor film formed on the side of the surface.
Figure 7B:
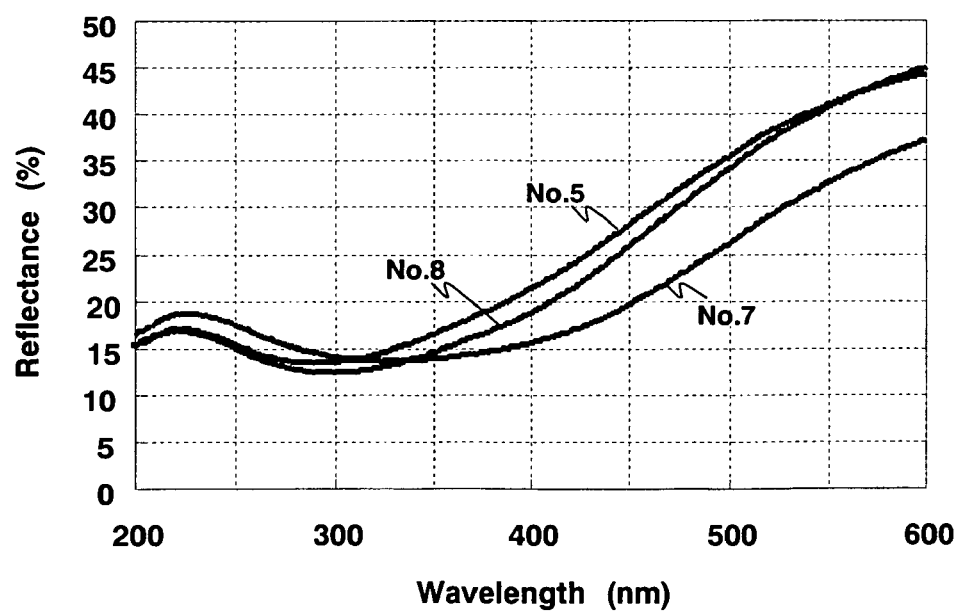
FIG. 7B is a graph for illustrating the reflectance characteristics of the light-shielding films shown in FIG. 7A.

FIGS. 7A and 7B are diagrams for illustrating the fact that the reflectance of the light-shielding film according to the present invention is predominantly determined by the light-element-rich and chromium-poor film located on the side of the surface. FIG. 7A includes schematic cross-sectional views for illustrating layered structures of light-shielding films, and FIG. 7B shows reflectance characteristics of the light-shielding films. Here, the light-element-rich and chromium-poor films shown in these drawings are also chromium oxynitride films (CrON films).

All the light-shielding films illustrated in these drawings have a total thickness of 500 sec in terms of film deposition time. As for the light-shielding film No. 5, the thickness of the light-element-rich and chromium-poor film 12a located on the side of the substrate is 200 sec (in terms of film deposition time), the thickness of the chromium-metal film 13 is 100 sec (in terms of film deposition time), and the thickness of the light-element-rich and chromium-poor film 12b located on the side of the surface is 200 sec (in terms of film deposition time). As for the light-shielding film No. 7, the thickness of the light-element-rich and chromium-poor film 12a located on the side of the substrate is 150 sec (in terms of film deposition time), the thickness of the chromium-metal film 13 is 100 sec (in terms of film deposition time), and the thickness of the light-element-rich and chromium-poor film 12b located on the side of the surface is 250 sec (in terms of film deposition time). As for the light-shielding film No. 8, the thickness of the light-element-rich and chromium-poor film 12a located on the side of the substrate is 200 sec (in terms of film deposition time), the thickness of the chromium-metal film 13 is 150 sec (in terms of film deposition time), and the thickness of the light-element-rich and chromium-poor film 12b located on the side of the surface is 150 sec (in terms of film deposition time).

As can be seen from FIG. 7B, the reflectance of the light-shielding film according to the present invention is predominantly determined by the thickness of the light-element-rich and chromium-poor film 12b located on the side of the surface and is not significantly affected by the thickness of the chromium-metal film 13 interposed between the upper and lower light-element-rich and chromium-poor films 12b and 12a.

Figure 8A:
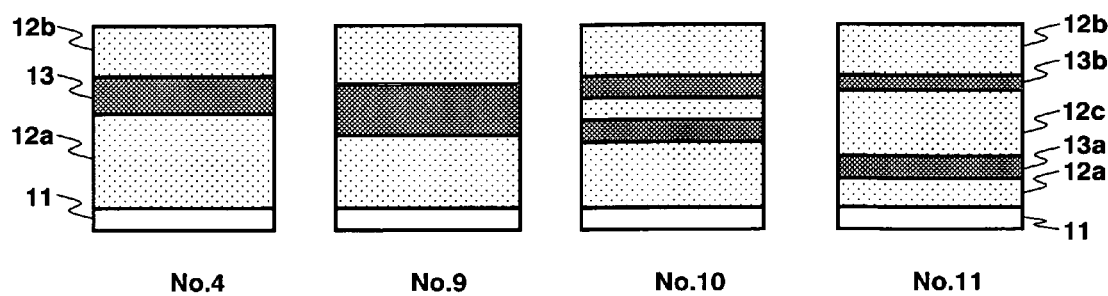
FIG. 8A includes schematic cross-sectional views for illustrating exemplary structures of light-shielding films having a plurality of chromium-metal films serving as transmittance adjustment films.
Figure 8B:
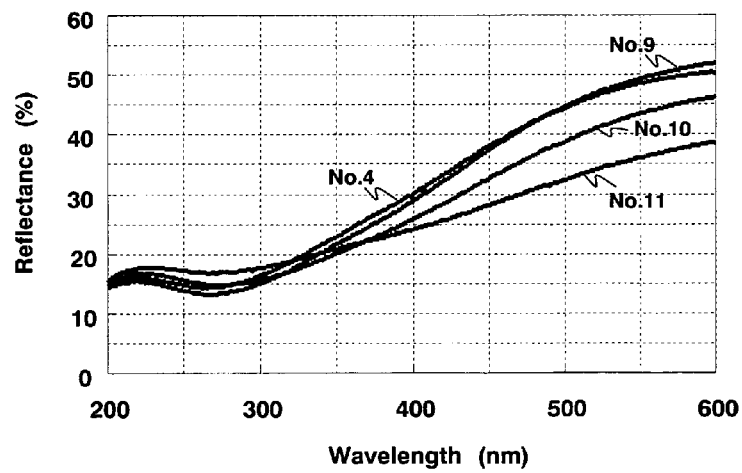
FIG. 8B is a graph for illustrating the reflectance characteristics of the light-shielding films shown in FIG. 8A.

FIGS. 8A and 8B are diagrams for illustrating exemplary structures of a light-shielding film that has a plurality of chromium-metal films as transmittance adjustment films and the effect of the chromium-metal films. FIG. 8A shows light-shielding films having only one chromium-metal film (Nos. 4 and 9) and light-shielding films having two chromium-metal films (Nos. 10 and 11). FIG. 8B shows reflectance characteristics of these light-shielding films. Here, the light-element-rich and chromium-poor films shown in FIG. 8A are also chromium oxynitride films (CrON films).

All the light-shielding films illustrated in these drawings have a total thickness of 500 sec in terms of film deposition time. As for the light-shielding film No. 4, the thickness of the light-element-rich and chromium-poor film 12a located on the side of the substrate is 250 sec (in terms of film deposition time), the thickness of the chromium-metal film 13 is 100 sec (in terms of film deposition time), and the thickness of the light-element-rich and chromium-poor film 12b located on the side of the surface is 150 sec (in terms of film deposition time). As for the light-shielding film No. 9, the thickness of the light-element-rich and chromium-poor film 12a located on the side of the substrate is 200 sec (in terms of film deposition time), the thickness of the chromium-metal film 13 is 150 sec (in terms of film deposition time), and the thickness of the light-element-rich and chromium-poor film 12b located on the side of the surface is 150 sec (in terms of film deposition time).

As for the light-shielding film No. 10, the thickness of the light-element-rich and chromium-poor film 12a located on the side of the substrate is 200 sec (in terms of film deposition time), the thickness of a chromium-metal film 13a located on the side of the substrate is 50 sec (in terms of film deposition time), the thickness of a chromium-metal film 13b located on the side of the surface is 50 sec (in terms of film deposition time), the thickness of alight-element-rich and chromium-poor film 12c interposed between the chromium-metal films 13a and 13b is 50 sec (in terms of film deposition time), and the thickness of the light-element-rich and chromium-poor film 12b located on the side of the surface is 150 sec (in terms of film deposition time).

As for the light-shielding film No. 11, the thickness of the light-element-rich and chromium-poor film 12a located on the side of the substrate is 75 sec (in terms of film deposition time), the thickness of the chromium-metal film 13a located on the side of the substrate is 50 sec (in terms of film deposition time), the thickness of the chromium-metal film 13b located on the side of the surface is 50 sec (in terms of film deposition time), the thickness of the light-element-rich and chromium-poor film 12c interposed between the chromium-metal films 13a and 13b is 175 sec (in terms of film deposition time), and the thickness of the light-element-rich and chromium-poor film 12b located on the side of the surface is 150 sec (in terms of film deposition time).

As shown in FIG. 8B, if the light-shielding film has a plurality of chromium-metal films as transmittance adjustment films, the reflectance of the light-shielding film is reduced, and the degree of reduction in reflection depends on the distance between the two chromium-metal films (or the thickness of the light-element-rich and chromium-poor film 12c).

In the case where the light-shielding film for ArF exposure is formed with a plurality of chromium-metal films, it is preferred that the distance between the chromium-metal films (that is, the thickness of the light-element-rich and chromium-poor film interposed there between) is equal to or more than 3 nm and equal to or less than 30 nm. This is because light of a wavelength of 193 nm forms a standing wave between the chromium-metal films to attenuate, so that the transmittance of the light-shielding film is reduced, and the light-shielding effect is enhanced.

EXAMPLE 2

Basic Structure of Photomask Blank

Figure 9A:
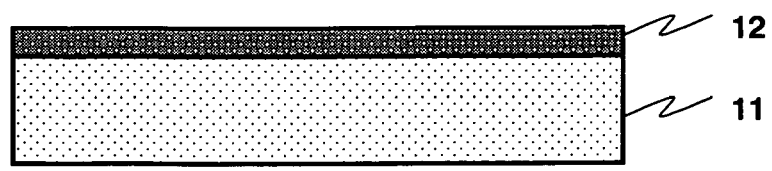
FIGS. 9A and 9B are schematic cross-sectional views for illustrating exemplary structures of photomask blanks according to the present invention.

FIG. 9A is a schematic cross-sectional view for illustrating an exemplary structure of a photomask blank according to the present invention, in which a light-shielding film 12 is formed on one principal plane of a transparent substrate 11 made of quartz or the like that serves as a photomask substrate. The light-shielding film 12 has the layered structure described above with regard to the example 1 and can serve not only as a "light-shielding film" but also as an antireflection film. The film of such a composition is used because it has excellent characteristics including dry etching characteristics, conductivity, and chemical resistance.

In the case where the photomask blank according to the present invention is designed for fabrication of a mask for ArF exposure, the thickness and composition of the light-shielding film 12 are selected so that the optical density OD of the light-shielding film 12 for light having a wavelength of 193 nm falls within a range of 2.5 to 3.5. Such an optical density OD can be achieved by setting the thickness of the film within a range of 50 nm to 80 nm. However, in order to reduce the dry-etching time to improve the patterning precision, the thickness of the film is preferably set within a range of 50 nm to 70 nm.

On the other hand, in the case where the photomask blank according to the present invention is designed for fabrication of a mask for KrF exposure, the thickness and composition of the light-shielding film 12 are selected so that the optical density OD of the light-shielding film 12 for light having a wavelength of 248 nm falls within a range of 2.5 to 3.5. Such an optical density OD can be achieved by setting the thickness of the film with in a range of 60 nm to 100 nm. However, in order to reduce the dry-etching time to improve the patterning precision, the thickness of the film is preferably set within a range of 60 nm to 90 nm.

Figure 9B:
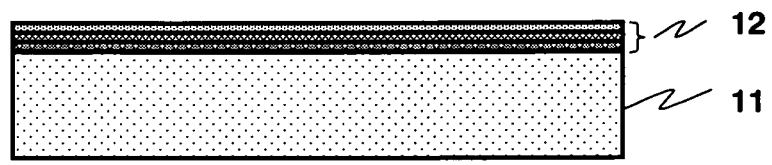

In the case where the light-shielding film 12 has a multi-layer film structure in which a plurality of layers having different optical characteristics are stacked on each other as shown in FIG. 9B, for example, it is preferred that the primary material of the uppermost layer is chromium oxide, chromium nitride or chromium oxynitride, and the percentage contents (atomic %) of oxygen, nitrogen and carbon at depths of 0.5 to 1.0 nm from the surface of the uppermost layer are selected so that the oxygen content>the nitrogen content >the carbon content. In addition, the thickness of the uppermost layer preferably falls within a range of 10 to 25 nm. Furthermore, in the case where the photomask blank according to the present invention is designed for fabrication of a mask for ArF exposure, the composition is preferably selected so that the extinction coefficient k of the uppermost layer of the multi-layer film for light having a wavelength of 193 nm falls within range of 1.0 to 1.5.

Under the conditions described above, the reflectance for light having an inspection wavelength (250 to 270 nm) can be readily controlled, and a satisfactory dry-etching rate in terms of OD can be assured. In addition, the basicity of the surface of the light-shielding film can be made adequate, and the effect of a chemically amplified resist on a photoacid generator is reduced, so that a high resist patterning precision can be maintained.

While the basic structure of the photomask blank according to the present invention has been described above, the "photomask blank" may be a structure that has a chemically amplified photoresist film previously formed on the light-shielding film 12. Here, the chemically amplified photoresist is used because it is highly sensitive and is suitable for fine patterning. In this case, the chemically amplified photoresist film is formed by applying the chemically amplified photoresist to a thickness of 250 nm or less.

Such a thickness of the chemically amplified photoresist film is adopted because, in the case of fabrication of a photomask for ArF exposure that requires fine patterning, the resist film is required to be relatively thin to avoid high aspect ratios.

In principle, a thinner resist film provides a better resolution. If the resist pattern is damaged during etching, the pattern fidelity is reduced. However, since the light-shielding film according to the present invention that can be readily etched requires a shorter etching time than conventional ones, a thinner resist film can be used. By using a resist film having a thickness of 200 nm or less, high working precision can be achieved.

In addition, the lower limit of the thickness of the resist film is determined by comprehensively taking into account various conditions including the etching resistance of the resist material. Typically, however, the thickness of the resist film is preferably equal to or more than 75 nm, and more preferably, equal to or more than 100 nm.

The chemically amplified resist used may be of a positive type or a negative type. A well-known resist, in particular, a resist of a polymer material having an aromatic structure is preferably used.

In the present invention, the spreadability is very important. For example, the photoresist for forming the chemically amplified photoresist film is added with (or contains) a surface-active agent with a percentage content of 10 to 1000 ppm, for example, and the percentage content of a solid constituent is adjusted to be equal to or less than 10 weight % of the organic solvent. The surface-active agent added to the chemically amplified photoresist may be a surface-active agent that contains a surface-active constituent having a fluorine substituent, a surface-active agent that contains a non-ionic surface-active constituent having neither a fluorine substituent nor a silicon containing substituent, or a mixture thereof.

EXAMPLE 3

Photomask Blank, and First Example of Patterning Process

Figure 10:
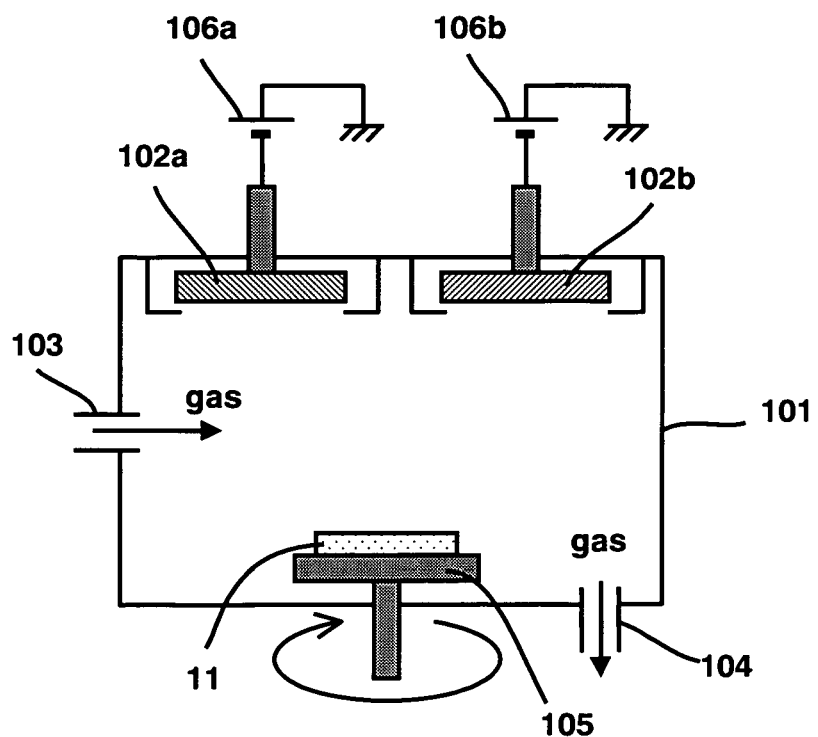
FIG. 10 is a diagram for illustrating an exemplary arrangement of a film deposition apparatus (sputtering apparatus) used for fabricating a photomask blank according to the present invention.

FIG. 10 shows an exemplary arrangement of a film deposition apparatus (sputtering apparatus) used for fabricating a photomask blank according to the present invention, and FIGS. 11A to 11D are diagrams for illustrating an exemplary process of patterning the photomask blank.

In FIG. 10, reference numeral 11 denotes a transparent substrate, which is a 6-inch rectangular quartz substrate. Typically, the surface and end faces of the quartz substrate are finely polished. Reference numeral 101 denotes a chamber, reference numeral 102a denotes a first target, reference numeral 102b denotes a second target, reference numeral 103 denotes a sputtering gas inlet, reference numeral 104 denotes a gas outlet, reference numeral 105 denotes a substrate turntable, and reference numerals 106a and 106b denote power supplies that apply a bias to the first and second targets, respectively.

The first target 102a and the second target 102b used were both chromium-metal targets for forming a light-shielding film. First, as sputtering gas, a gas mixture containing Ar gas at a flow rate of 15 sccm, $N_2$ gas at a flow rate of 30 sccm and $O_2$ gas at a flow rate of 15 sccm was introduced into the chamber 101 to achieve a gas pressure of 0.1 Pa in the chamber. A discharge power of 500 W was applied to each of the first target 102a and the second target 102b while the substrate 11 was being rotated at 30 rpm, thereby forming a CrON film having a chromium content of 50 atomic % or less in terms of atomic ratio to a thickness of 70 nm.

The conditions for deposition of the light-shielding film can be changed in various ways depending on the film composition or design of the stack structure. For example, in the case where a CrONC film is to be formed, the sputtering gas introduced may contain one or more kinds of carbon-containing gas, such as $CH_4$, $CO_2$ and CO, one or more kinds of nitrogen-containing gas, such as NO, $NO_2$ and $N_2$ and one or more kinds of oxygen-containing gas, such as $CO_2$, NO and $O_2$ or further contain an inert gas, such as Ar, Ne and Kr, mixed with these gases. In particular, $CO_2$ gas or CO gas that doubles as a carbon source and an oxygen source is preferably used from the viewpoint of in-plane uniformity of the substrate and controllability of the fabrication process. Furthermore, the various kinds of sputtering gases may be introduced separately into the chamber, or some or all of the sputtering gases may be mixed and introduced into the chamber.

The CrON film having a chromium content of 50 atomic % or less in terms of atomic ratio preferably contains 40 to 50 atomic % of Cr, 10 to 35 atomic % of N and 25 to 50 atomic % of O. More preferably, the CrON film contains 40 to 45 atomic % of Cr, 15 to 30 atomic % of N and 30 to 50 atomic % of O. In addition, a CrONC film having a chromium content of 50 atomic % or less in terms of atomic ratio preferably contains 40 to 50 atomic % of Cr, 10 to 35 atomic % of N, 25 to 50 atomic % of O and 5 to 15 atomic % of C. More preferably, the CrONC film contains 40 to 45 atomic % of Cr, 15 to 30 atomic % of N, 30 to 50 atomic % of O and 5 to 15 atomic % of C.

Figure 11A:
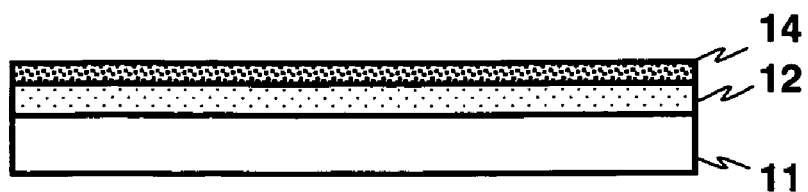
FIGS. 11A to 11D are diagrams for illustrating an exemplary process of patterning a photomask blank according to the present invention.

When performing patterning in mask fabrication using a photomask blank according to the present invention, first, a chemically amplified photoresist film 14 having a thickness of 250 nm or less is formed by application on a principal plane of the photomask blank, which comprises the transparent substrate 11 and the light-shielding film 12 having the composition and thickness described above with regard to the examples 1 and 2 stacked on the substrate 11 (FIG. 11A). Considering that typical photoresist films have a thickness of about 300 nm, the thickness of 250 nm means that the film thickness is reduced by about 17%. As described earlier, such a structure having the chemically amplified photoresist 14 applied thereto can also be considered as the "photomask blank".

Prior to formation of the photoresist film 14, a surface treatment to reduce the surface energy of the surface on which the photoresist film 14 is to be formed (the surface of the light-shielding film 12) is preferably performed in order to prevent problems, such as peel-off and falling of the fine pattern, from occurring during a subsequent step of the process. A preferred surface treatment is a process of alkylsilylating the photomask substrate surface by hexamethyldisilazane (HMDS), which is commonly used in the semiconductor manufacturing process, or other organic-silicon-based surface treatment agent. The surface of the substrate may be exposed to gas of such a surface treatment agent, or the surface treatment agent may be directly applied to the surface of the substrate.

Figure 11B:
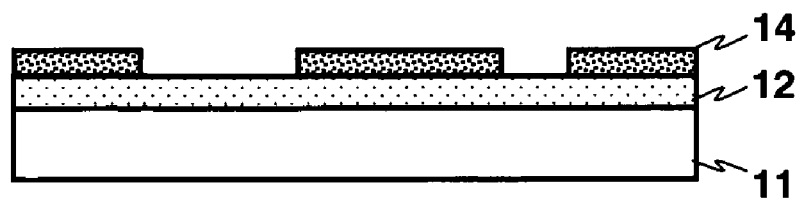
Figure 11C:
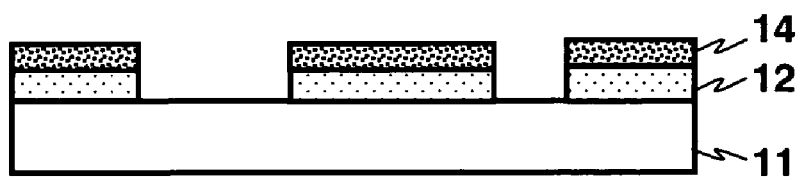
Figure 11D:
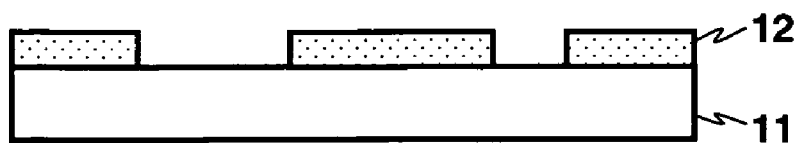

The photoresist film 14 is shaped into a resist pattern (FIG. 11B). Using the resulting resist pattern as a mask, the light-shielding film 12 is patterned by oxygen-and-chlorine-based dry etching (FIG. 11C). Finally, the remaining photoresist film 14 is removed to provide a photomask (FIG. 11D).

In this example, the clear time of the light-shielding film 12 (by chlorine-and-oxygen-based dry etching) is 300 seconds. Thus, compared with the clear time of 480 seconds of the conventional light-shielding film, the clear time is substantially reduced. In addition, the photoresist (mask) after the dry etching was observed with a scanning electron microscope, and then, it was confirmed that the damage to the photoresist was reduced because of the reduction of the clear time.

EXAMPLE 4

Photomask Blank, and Second Example of Patterning Process

This example will be described also with reference to FIGS. 10 and 11A to 11D. The arrangement of the film deposition apparatus (sputtering apparatus) is the same as described above, and the substrate used is also a transparent substrate, which is a 6-inch rectangular quartz substrate.

The first target 102a and the second target 102b used were both chromium-metal targets for forming a light-shielding film on the transparent substrate. First, as sputtering gas, a gas mixture containing Ar gas at a flow rate of 15 sccm, $N_2$ gas at a flow rate of 30 sccm and $O_2$ gas at a flow rate of 15 sccm was introduced into the chamber 101 to achieve a gas pressure of 0.1 Pa in the chamber. A discharge power of 500 W was applied to each of the first target 102a and the second target 102b while the substrate 11 was being rotated at 30 rpm, thereby forming a CrON film having a thickness of 30 nm.

Then, Ar gas at a flow rate of 30 sccm was introduced into the chamber 101 to achieve a gas pressure of 0.1 Pa in the chamber. A discharge power of 500 W was applied to each of the first target 102a and the second target 102b while the substrate 11 was being rotated at 30 rpm, thereby forming a Cr film having a thickness of 15 nm.

Furthermore, a gas mixture containing Ar gas at a flow rate of 15 sccm, $N_2$ gas at a flow rate of 30 sccm and $O_2$ gas at a flow rate of 15 sccm was introduced into the chamber 101 to achieve a gas pressure of 0.1 Pa in the chamber. A discharge power of 500 W was applied to each of the first target 102a and the second target 102b while the substrate 11 was being rotated at 30 rpm, thereby forming a CrON film having a thickness of 25 nm. In this way, a light-shielding film having a total thickness of 70 nm, 70% or more of which was accounted for by the chromium-compound film having a chromium content of 50 atomic % or less in terms of atomic ratio, was formed.

The conditions for deposition of the light-shielding film can be changed in various ways depending on the film composition or design of the stack structure. For example, in the case where a CrONC film is to be formed, the sputtering gas introduced may contain one or more kinds of carbon-containing gas, such as $CH_4$, $CO_2$ and CO, one or more kinds of nitrogen-containing gas, such as NO, $NO_2$ and $N_2$ and one or more kinds of oxygen-containing gas, such as $CO_2$, NO and $O_2$ or further contain an inert gas, such as Ar, Ne and Kr, mixed with these gases. In particular, $CO_2$ gas or CO gas that doubles as a carbon source and an oxygen source is preferably used from the viewpoint of in-plane uniformity of the substrate and controllability of the fabrication process. Furthermore, the various kinds of sputtering gases may be introduced separately into the chamber, or some or all of the sputtering gases may be mixed and introduced into the chamber.

The CrON film having a chromium content of 50 atomic % or less in terms of atomic ratio preferably contains 40 to 50 atomic % of Cr, 10 to 35 atomic % of N and 25 to 50 atomic % of O. More preferably, the CrON film contains 40 to 45 atomic % of Cr, 15 to 30 atomic % of N and 30 to 50 atomic % of O. In addition, a CrONC film having a chromium content of 50 atomic % or less in terms of atomic ratio preferably contains 40 to 50 atomic % of Cr, 10 to 35 atomic % of N, 25 to 50 atomic % of O and 5 to 15 atomic % of C. More preferably, the CrONC film contains 40 to 45 atomic % of Cr, 15 to 30 atomic % of N, 30 to 50 atomic % of O and 5 to 15 atomic % of C.

When performing patterning in mask fabrication using a photomask blank according to the present invention, first, a chemically amplified photoresist film 14 having a thickness of 250 nm or less is formed by application on a principal plane of the photomask blank, which comprises the transparent substrate 11 and the light-shielding film 12 having the composition and thickness described above with regard to the examples 1 and 2 formed on the substrate 11 (FIG. 11A). Considering that typical photoresist films have a thickness of about 300 nm, the thickness of 250 nm means that the film thickness is reduced by about 17%. As described earlier, such a structure having the chemically amplified photoresist 14 applied thereto can also be considered as the "photomask blank".

Prior to formation of the photoresist film 14, a surface treatment to reduce the surface energy of the surface on which the photoresist film 14 is to be formed (the surface of the light-shielding film 12) is preferably performed in order to prevent problems, such as peel-off and falling of the fine pattern, from occurring during a subsequent step of the process. A preferred surface treatment is a process of alkylsilylating the photomask substrate surface by hexamethyldisilazane (HMDS), which is commonly used in the semiconductor manufacturing process, or other organic-silicon-based surface treatment agent. The surface of the substrate may be exposed to gas of such a surface treatment agent, or the surface treatment agent may be directly applied to the surface of the substrate.

The photoresist film 14 is shaped into a resist pattern (FIG. 11B). Using the resulting resist pattern as a mask, the light-shielding film 12 is patterned by oxygen-and-chlorine-based dry etching (FIG.11C). Finally, the remaining photoresist film 14 is removed to provide a photomask (FIG. 11D).

In this example, the clear time of the light-shielding film 12 (by chlorine-and-oxygen-based dry etching) is 300 seconds. Thus, compared with the clear time of 480 seconds of the conventional light-shielding film, the clear time is substantially reduced. In addition, the photoresist (mask) after the dry etching was observed with a scanning electron microscope, and then, it was confirmed that the damage to the photoresist was reduced because of the reduction of the clear time.

EXAMPLE 5

Basic structure of phase shift mask blank according to the present invention

The photomask blank according to the present invention may be configured as a phase shift mask blank. In this case, in deposition of the light-shielding film, a translucent film that has a region containing both silicon (Si) and molybdenum (Mo), such as a region of MoSi, is provided on the surface on which the light-shielding film is to be deposited. The translucent film will be described later.

The composition and stack structure of the light-shielding film of the phase-shift mask blank are appropriately selected so that the mask blank fabricated has a required optical characteristic. Preferably, the light-shielding film is designed so that the transmittance to exposure light is equal to or higher than 0.01% and equal to or lower than 5%, and the reflectance to light having a wavelength from 250 nm to 270 nm is equal to or higher than 10% and equal to or lower than 20%. In order to assure high patterning precision, the physical film thickness is preferably small. The light-shielding film is preferably designed to have a total thickness equal to or less than 60 nm.

Figure 12A:
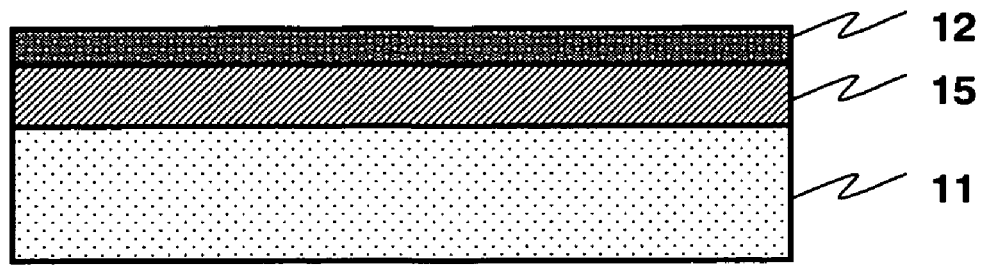
FIGS. 12A to 12C are schematic cross-sectional views for illustrating exemplary structures of phase-shift mask blanks according to the present inventions.

FIG. 12A is a schematic cross-sectional view for illustrating an exemplary structure of a half-tone phase-shift mask blank according to the present invention, in which a translucent film 15 having a predetermined phase-shift capability and a predetermined transmittance to exposure light is formed on one principal plane of a transparent substrate 11 made of quartz or the like that serves as a photomask substrate, and a light-shielding film 12 is formed on the translucent film 15. The light-shielding film 12 has the layered structure described above with regard to the example 1 and can serve not only as a "light-shielding film" but also as an antireflection film. In addition, the translucent film 15 is a half-tone phase-shift layer containing an absorber material that is a half-tone material containing both silicon (Si) and molybdenum (Mo). The film of such a composition is used because it has excellent characteristics including dry etching characteristics, conductivity, and chemical resistance.

In the case where the half-tone phase-shift mask blank according to the present invention is designed for fabrication of a mask for ArF exposure, the thickness and composition of the light-shielding film 12 are selected so that the optical density OD of the light-shielding film 12 for light having a wavelength of 193 nm falls within a range of 1.2 to 2.3. Such an optical density OD can be achieved by setting the thickness of the film within a range of 25 nm to 60 nm. However, in order to reduce the dry-etching time to improve the patterning precision, the thickness of the film is preferably set within a range of 25 nm to 50 nm.

On the other hand, in the case where the photomask blank according to the present invention is designed for fabrication of a mask for KrF exposure, the thickness and composition of the light-shielding film 12 are selected so that the optical density OD of the light-shielding film 12 for light having a wavelength of 248 nm falls within a range of 1.2 to 2.3. Such an optical density OD can be achieved by setting the thickness of the film within a range of 30 nm to 70 nm. However, in order to reduce the dry-etching time to improve the patterning precision, the thickness of the film is preferably set within a range of 30 nm to 60 nm.

Figure 12B:
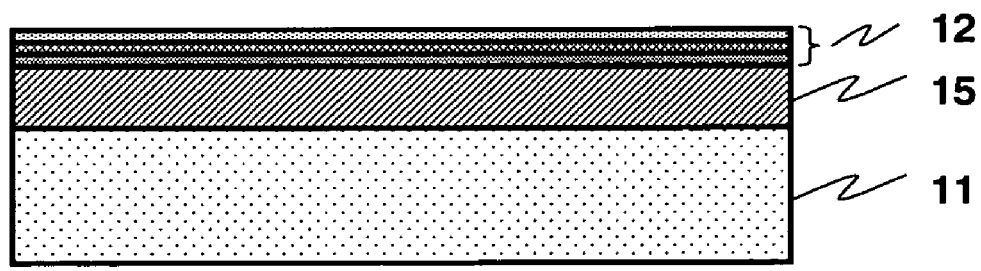

In the case where the light-shielding film 12 has a multilayer film structure in which a plurality of layers having different optical characteristics are stacked on each other as shown in FIG. 12B, for example, it is preferred that the primary material of the uppermost layer is chromium oxide, chromium nitride or chromium oxynitride, and the percentage contents (atomic %) of oxygen, nitrogen and carbon at depths of 0.5 to 1.0 nm from the surface of the uppermost layer are selected so that the oxygen content>the nitrogen content>the carbon content. In addition, the thickness of the uppermost layer preferably falls within a range of 10 to 25 nm.

Furthermore, in the case where the half-tone phase-shift mask blank according to the present invention is designed for fabrication of a mask for ArF exposure, the composition is preferably selected so that the extinction coefficient k of the uppermost layer of the multilayer film for light having a wavelength of 193 nm falls within range of 1.0 to 1.5.

Under the conditions described above, the reflectance for light having an inspection wavelength (250 to 270 nm) can be readily controlled, and a satisfactory dry-etching rate in terms of OD can be assured. In addition, the basicity of the surface of the light-shielding film can be made adequate, and the effect of a chemically amplified resist on a photoacid generator is reduced, so that a high resist patterning precision can be maintained.

Figure 12C:
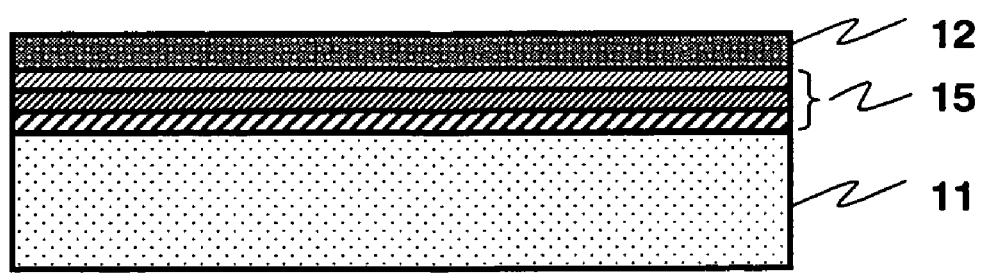

The translucent film 15 may be not only a single-layer film but also a multilayer film including two or more layers having different compositions as shown in FIG. 12C, for example. In the case of the multilayer film structure, at least one of the layers constituting the translucent film 15 should contain both silicon and molybdenum. In addition, such a single-layer or multilayer translucent film 15 is adapted to have a transmittance of 2 to 40% and provides a phase shift of about 180 degrees, for example. In some cases, the translucent film can be adapted to provide a phase shift of 10 degrees or less.

In the case where the translucent film 15 has a multilayer structure, the optical characteristic of the translucent film 15 can be readily adjusted if the two or more layers constituting the translucent film 15 include a light-absorbing layer and a phase-shift layer. In this case, an unsaturated metal compound forming the light-absorbing layer is preferably an unsaturated metal silicide oxide, an unsaturated metal silicide oxynitride, or an unsaturated metal silicide oxynitride carbide. In the case of the unsaturated metal silicide oxide, the light-absorbing layer contains 0.2 to 80 atomic % of M, 19 to 90 atomic % of Si and 0.1 to 60 atomic % of O. Here, the character "M" denotes a transition metal, such as molybdenum (Mo). In the case of the unsaturated metal silicide oxynitride, the light-absorbing layer preferably contains 0.2 to 80 atomic % of M, 19 to 90 atomic % of Si, 0.1 to 50 atomic % of O and 0.1 to 50 atomic % of N. In the case of the unsaturated metal silicide oxynitride carbide, the light-absorbing layer preferably contains 0.2 to 80 atomic % of M, 19 to 90 atomic % of Si, 0.1 to 45 atomic % of O, 0.1 to 45 atomic % of N and 0.1 to 30 atomic % of C.

Such unsaturated compounds can be formed by reactive sputtering by appropriately introducing an oxygen-containing gas, a nitrogen-containing gas and a carbon-containing gas as sputtering gas. The ratio among oxygen, nitrogen and carbon can be appropriately adjusted by using the reactive sputtering technique, and thus, the optical characteristic can be adjusted, and the design flexibility can be advantageously improved.

In addition, as a material for the phase-shift layer, a metal silicide oxide, a metal silicide oxynitride and a metal silicide oxynitride carbide are preferably used. In the case of the metal silicide oxide, the phase-shift layer preferably contains 0.2 to 25 atomic % of M, 10 to 42 atomic % of Si and 30 to 60 atomic % of O. In the case of the metal silicide oxynitride, the phase-shift layer preferably contains 0.2 to 25 atomic % of M, 10 to 57 atomic % of Si, 2 to 20 atomic % of O and 5 to 57 atomic % of N. In the case of the metal silicide oxynitride carbide, the phase-shift layer preferably contains 0.2 to 25 atomic % of M, 10 to 57 atomic % of Si, 2 to 20 atomic % of O, 5 to 57 atomic % of N and 0.5 to 30 atomic % of C. Again, the character "M" denotes a transition metal, such as molybdenum (Mo).

Such a phase-shift layer can be formed by reactive sputtering by using a metal target, a silicon target and a metal silicide target appropriately selected depending on the composition of the phase-shift layer to be formed and by appropriately introducing an oxygen-containing gas, a nitrogen-containing gas and a carbon-containing gas along with an inert gas, such as neon, argon and krypton.

While the basic structure of the half-tone phase-shift mask blank according to the present invention has been described above, the "half-tone phase-shift mask blank" may be a structure that has a chemically amplified resist film previously formed on the light-shielding film 12. Here, the chemically amplified photoresist is used because it is highly sensitive and is suitable for fine patterning. In this case, the chemically amplified photoresist film is formed by applying the chemically amplified photoresist to a thickness of 250 nm or less.

Such a thickness of the chemically amplified photoresist film is adopted because, in the case of fabrication of a photomask for ArF exposure that requires fine patterning, the resist film is required to be relatively thin to avoid high aspect ratios.

In principle, a thinner resist film provides a better resolution. If the resist pattern is damaged during etching, the pattern fidelity is reduced. However, since the light-shielding film according to the present invention that can be readily etched requires a shorter etching time than conventional ones, a thinner resist film can be used. By using a resist film having a thickness of 200 nm or less, a high working precision can be achieved.

In addition, the lower limit of the thickness of the resist film is determined by comprehensively taking into account various conditions including the etching resistance of the resist material. Typically, however, the thickness of the resist film is preferably equal to or more than 75 nm, and more preferably, equal to or more than 100 nm.

The chemically amplified resist used may be of a positive type or a negative type. A well-known resist, in particular, a resist of a polymer material having an aromatic structure is preferably used.

In the present invention, the spreadability is very important. For example, the photoresist for forming the chemically amplified photoresist film is added with (or contains) a surface-active agent with a percentage content of 10 to 1000 ppm, for example, and the percentage content of a solid constituent is adjusted to be equal to or less than 10 weight % of the organic solvent. The surface-active agent added to the chemically amplified photoresist may be a surface-active agent that contains a surface-active constituent having a fluorine substituent, a surface-active agent that contains a non-ionic surface-active constituent having neither a fluorine substituent nor a silicon containing substituent, or a mixture thereof.

EXAMPLE 6

Phase-shift Mask Blank and First Example of Patterning Process

FIG. 10 shows an exemplary arrangement of a film deposition apparatus (sputtering apparatus) used for fabricating a half-tone phase-shift mask blank according to the present invention, and FIGS. 13A to 13D are diagrams for illustrating an exemplary process of patterning the half-tone phase-shift mask blank.

In FIG. 10, reference numeral 11 denotes a transparent substrate, which is a 6-inch rectangular quartz substrate. Typically, the surface and end faces of the quartz substrate are finely polished. Reference numeral 101 denotes a chamber, reference numeral 102a denotes a first target, reference numeral 102b denotes a second target, reference numeral 103 denotes a sputtering gas inlet, reference numeral 104 denotes a gas outlet, reference numeral 105 denotes a substrate turntable, and reference numerals 106a and 106b denote power supplies that apply a bias to the first and second targets, respectively.

As a translucent film 15, a half-tone phase-shift layer containing an absorber material that is a half-tone material containing both silicon (Si) and molybdenum (Mo) is formed on the quartz substrate 11. The first target 102a used in this step is a single crystal silicon (Si) target, and the second target used in this step is a polycrystalline molybdenum silicide ($MoSi_3$) target. The gas flow rate was set so that the gas pressure in the chamber during film deposition was 0.1 Pa, and a molybdenum silicide compound film (MoSiN film) was formed while rotating the substrate at 30 rpm.

Specifically, film deposition was started by introducing Ar gas at a flow rate of 20 sccm and $N_2$ gas at a flow rate of 0 (zero) sccm into the chamber 101 to achieve a gas pressure of 0.1 Pa in the chamber, applying a discharge power of 700 W to the $MoSi_3$ target and a discharge power of 300 W to the Si target, and rotating the substrate 11 at 30 rpm. Then, the translucent film having a thickness of about 20 nm was formed by continuously changing the film deposition conditions in such a manner that the flow rates of Ar gas and $N_2$ gas introduced into the chamber 101 were gradually changed to 5 sccm and 50 sccm, respectively, while keeping the gas pressure in the chamber at 0.1 Pa, and the discharge powers applied to the $MoSi_3$ target and the Si target were gradually changed to 100 W and 900 W, respectively. Under such film deposition conditions, a "gradient structure" film that has a composition gradient in which the transition metal content and the nitrogen content gradually change can be formed.

Then, a light-shielding film was formed on the translucent film using a first target 102a and a second target 102b that were both chromium-metal targets. First, as sputtering gas, a gas mixture containing Ar gas at a flow rate of 15 sccm, $N_2$ gas at a flow rate of 30 sccm and $O_2$ gas at a flow rate of 15 sccm was introduced into the chamber 101 to achieve a gas pressure of 0.1 Pa in the chamber. A discharge power of 500 W was applied to each of the first target 102a and the second target 102b while the substrate 11 was being rotated at 30 rpm, thereby forming a CrON film having a chromium content of 50 atomic % or less in terms of atomic ratio to a thickness of 48 nm.

The conditions for deposition of the light-shielding film can be changed in various ways depending on the film composition or design of the stack structure. For example, in the case where a CrONC film is to be formed, the sputtering gas introduced may contain one or more kinds of carbon-containing gas, such as $CH_4$, $CO_2$ and CO, one or more kinds of nitrogen-containing gas, such as NO, $NO_2$ and $N_2$ and one or more kinds of oxygen-containing gas, such as $CO_2$, NO and $O_2$ or further contain an inert gas, such as Ar, Ne and Kr, mixed with these gases. In particular, $CO_2$ gas or CO gas that doubles as a carbon source and an oxygen source is preferably used from the viewpoint of in-plane uniformity of the substrate and controllability of the fabrication process. Furthermore, the various kinds of sputtering gases may be introduced separately into the chamber, or some or all of the sputtering gases may be mixed and introduced into the chamber.

The CrON film having a chromium content of 50 atomic % or less in terms of atomic ratio preferably contains 40 to 50 atomic % of Cr, 10 to 35 atomic % of N and 25 to 50 atomic % of O. More preferably, the CrON film contains 40 to 45 atomic % of Cr, 15 to 30 atomic % of N and 30 to 50 atomic % of O. In addition, a CrONC film having a chromium content of 50 atomic % or less in terms of atomic ratio preferably contains 40 to 50 atomic % of Cr, 10 to 35 atomic % of N, 25 to 50 atomic % of O and 5 to 15 atomic % of C. More preferably, the CrONC film contains 40 to 45 atomic % of Cr, 15 to 30 atomic % of N, 30 to 50 atomic % of O and 5 to 15 atomic % of C.

Figure 13A:
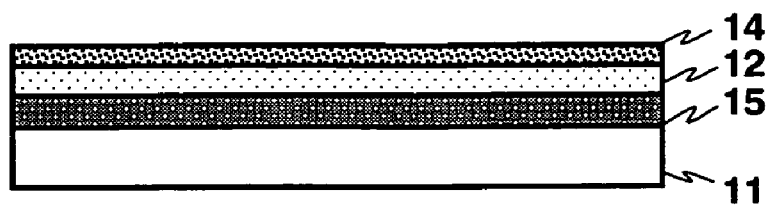
FIGS. 13A to 13D are diagrams for illustrating an exemplary process of patterning a phase-shift mask blank according to the present invention.

When performing patterning in mask fabrication using a half-tone phase-shift mask blank according to the present invention, first, a chemically amplified photoresist film 14 having a thickness of 250 nm or less is formed by application on a principal plane of the half-tone phase-shift mask blank, which comprises the transparent substrate 11 and the translucent film 15 and light-shielding film 12 having the compositions and thicknesses described above with regard to the examples 1 and 5 stacked on the substrate 11 (FIG. 13A). Considering that typical photoresist films have a thickness of about 300 nm, the thickness of 250 nm means that the film thickness is reduced by about 17%. As described earlier, such a structure having the chemically amplified photoresist 14 applied thereto can also be considered as the "phase-shift mask blank".

Prior to formation of the photoresist film 14, a surface treatment to reduce the surface energy of the surface on which the photoresist film 14 is to be formed (the surface of the light-shielding film 12) is preferably performed in order to prevent problems, such as peel-off and falling of the fine pattern, from occurring during a subsequent step of the process. A preferred surface treatment is a process of alkylsilylating the photomask substrate surface by hexamethyldisilazane (HMDS), which is commonly used in the semiconductor manufacturing process, or other organic-silicon-based surface treatment agent. The surface of the substrate may be exposed to gas of such a surface treatment agent, or the surface treatment agent may be directly applied to the surface of the substrate.

Figure 13B:
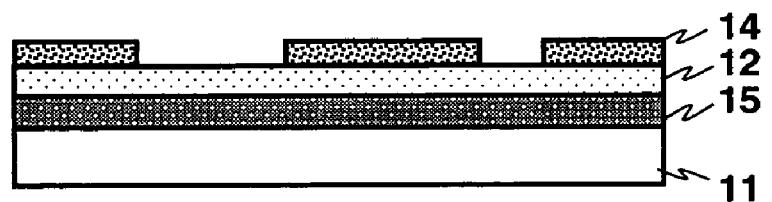
Figure 13C:
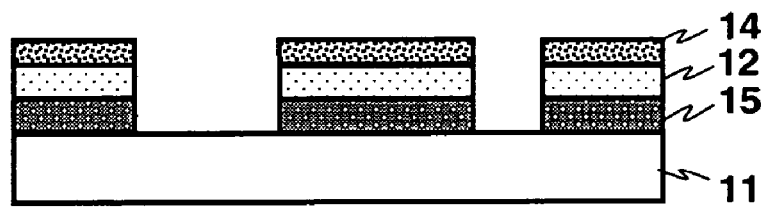
Figure 13D:
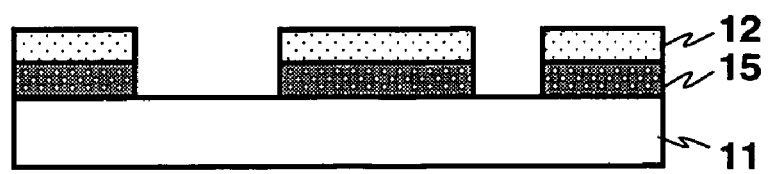

The photoresist film 14 is shaped into a resist pattern (FIG. 13B). Using the resulting resist pattern as a mask, the light-shielding film 12 and the translucent film 15 are patterned by oxygen-and-chlorine-based dry etching (FIG. 13C). Finally, the remaining photoresist film 14 is removed to provide a photomask (FIG. 13D).

In this example, the clear time of the light-shielding film 12 (by chlorine-and-oxygen-based dry etching) is 200 seconds. Thus, compared with the clear time of 320 seconds of the conventional light-shielding film, the clear time is substantially reduced. In addition, the photoresist (mask) after the dry etching was observed with a scanning electron microscope, and then, it was confirmed that the damage to the photoresist was reduced because of the reduction of the clear time.

EXAMPLE 7

Phase-shift mask blank, and Second Example of Patterning Process

This example will be described also with reference to FIGS. 10 and 13A to 13D. The arrangement of the film deposition apparatus (sputtering apparatus) is the same as described above, and the substrate used is also a transparent substrate, which is a 6-inch rectangular quartz substrate.

As a translucent film 15, a half-tone phase-shift layer containing an absorber material that is a half-tone material containing both silicon (Si) and molybdenum (Mo) is formed on the quartz substrate 11. The first target 102a used in this step is a single crystal silicon (Si) target, and the second target used in this step is a polycrystalline molybdenum silicide ($MoSi_3$) target. The gas flow rate was set so that the gas pressure in the chamber during film deposition was 0.1 Pa, and a molybdenum silicide compound film (MoSiN film) was formed while rotating the substrate at 30 rpm.

Specifically, film deposition was started by introducing Ar gas at a flow rate of 20 sccm and $N_2$ gas at a flow rate of 0 (zero) sccm into the chamber 101 to achieve a gas pressure of 0.1 Pa in the chamber, applying a discharge power of 700 W to the $MoSi_3$ target and a discharge power of 300 W to the Si target, and rotating the substrate 11 at 30 rpm. Then, the translucent film having a thickness of about 20 nm was formed by continuously changing the film deposition conditions in such a manner that the flow rates of Ar gas and $N_2$ gas introduced into the chamber 101 were gradually changed to 5 sccm and 50 sccm, respectively, while keeping the gas pressure in the chamber at 0.1 Pa, and the discharge powers applied to the $MoSi_3$ target and the Si target were gradually changed to 100 W and 900 W, respectively. Under such film deposition conditions, a "gradient structure" film that has a composition gradient in which the transition metal content and the nitrogen content gradually change can be formed.

Then, a light-shielding film was formed on the translucent film using a first target 102a and a second target 102b that were both chromium-metal targets. First, as sputtering gas, a gas mixture containing Ar gas at a flow rate of 15 sccm, $N_2$ gas at a flow rate of 30 sccm and $O_2$ gas at a flow rate of 15 sccm was introduced into the chamber 101 to achieve a gas pressure of 0.1 Pa in the chamber. A discharge power of 500 W was applied to each of the first target 102a and the second target 102b while the substrate 11 was being rotated at 30 rpm, thereby forming a CrON film having a thickness of 20 nm.

Then, Ar gas at a flow rate of 30 sccm was introduced into the chamber 101 to achieve a gas pressure of 0.1 Pa in the chamber. A discharge power of 500 W was applied to each of the first target 102a and the second target 102b while the substrate 11 was being rotated at 30 rpm, thereby forming a Cr film having a thickness of 7 nm.

Furthermore, a gas mixture containing Ar gas at a flow rate of 15 sccm, $N_2$ gas at a flow rate of 30 sccm and $O_2$ gas at a flow rate of 15 sccm was introduced into the chamber 101 to achieve a gas pressure of 0.1 Pa in the chamber. A discharge power of 500 W was applied to each of the first target 102a and the second target 102b while the substrate 11 was being rotated at 30 rpm, thereby forming a CrON film having a thickness of 20 nm. In this way, a light-shielding film having a total thickness of 47 nm, 70% or more of which was accounted for by the chromium-compound film having a chromium content of 50 atomic % or less in terms of atomic ratio, was formed.

The conditions for deposition of the light-shielding film can be changed in various ways depending on the film composition or design of the stack structure. For example, in the case where a CrONC film is to be formed, the sputtering gas introduced may contain one or more kinds of carbon-containing gas, such as $CH_4$, $CO_2$ and CO, one or more kinds of nitrogen-containing gas, such as NO, $NO_2$ and $N_2$ and one or more kinds of oxygen-containing gas, such as $CO_2$, NO and $O_2$ or further contain an inert gas, such as Ar, Ne and Kr, mixed with these gases. In particular, $CO_2$ gas or CO gas that doubles as a carbon source and an oxygen source is preferably used from the viewpoint of in-plane uniformity of the substrate and controllability of the fabrication process. Furthermore, the various kinds of sputtering gases may be introduced separately into the chamber, or some or all of the sputtering gases may be mixed and introduced into the chamber.

The CrON film having a chromium content of 50 atomic % or less in terms of atomic ratio preferably contains 40 to 50 atomic % of Cr, 10 to 35 atomic % of N and 25 to 50 atomic % of O. More preferably, the CrON film contains 40 to 45 atomic % of Cr, 15 to 30 atomic % of N and 30 to 50 atomic % of O. In addition, a CrONC film having a chromium content of 50 atomic % or less in terms of atomic ratio preferably contains 40 to 50 atomic % of Cr, 10 to 35 atomic % of N, 25 to 50 atomic % of O and 5 to 15 atomic % of C. More preferably, the CrONC film contains 40 to 45 atomic % of Cr, 15 to 30 atomic % of N, 30 to 50 atomic % of O and 5 to 15 atomic % of C.

When performing patterning in mask fabrication using a half-tone phase-shift mask blank according to the present invention, first, a chemically amplified photoresist film 14 having a thickness of 250 nm or less is formed by application on a principal plane of the half-tone phase-shift mask blank, which comprises the transparent substrate 11 and the translucent film 15 and light-shielding film 12 having the compositions and thicknesses described above with regard to the examples 1 and 5 stacked on the substrate 11 (FIG. 13A). Considering that typical photoresist films have a thickness of about 300 nm, the thickness of 250 nm means that the film thickness is reduced by about 17%. As described earlier, such a structure having the chemically amplified photoresist 14 applied thereto can also be considered as the "phase-shift mask blank".

Prior to formation of the photoresist film 14, a surface treatment to reduce the surface energy of the surface on which the photoresist film 14 is to be formed (the surface of the light-shielding film 12) is preferably performed in order to prevent problems, such as peel-off and falling of the fine pattern, from occurring during a subsequent step of the process. A preferred surface treatment is a process of alkylsilylating the photomask substrate surface by hexamethyldisilazane (HMDS), which is commonly used in the semiconductor manufacturing process, or other organic-silicon-based surface treatment agent. The surface of the substrate may be exposed to gas of such a surface treatment agent, or the surface treatment agent may be directly applied to the surface of the substrate.

The photoresist film 14 is shaped into a resist pattern (FIG. 13B). Using the resulting resist pattern as a mask, the light-shielding film 12 and the translucent film 15 are patterned by oxygen-and-chlorine-based dry etching (FIG. 13C). Finally, the remaining photoresist film 14 is removed to provide a photomask (FIG. 13D).

In this example, the clear time of the light-shielding film 12 (by chlorine-and-oxygen-based dry etching) is 200 seconds. Thus, compared with the clear time of 320 seconds for the conventional light-shielding film, the clear time is substantially reduced. In addition, the photoresist (mask) after the dry etching was observed with a scanning electron microscope, and then, it was confirmed that the damage to the photoresist was reduced because of the reduction of the clear time.

The photomask blank and the phase-shift mask blank and the photomasks fabricated using the mask blanks according to the present invention have been described above with reference to the examples. However, the examples described above are intended only for illustrating the present invention, and the present invention is not limited thereto. It will be apparent from the above description that various modifications of the examples are included in the scope of the present invention, and various other examples are possible without departing from the scope of the present invention.

The present invention provides a photomask having a precise fine pattern and a photomask blank used for fabricating the photomask.

What is claimed is:

1. A photomask blank comprising:
a transparent substrate; and
a light-shielding film for exposure light formed on the transparent substrate,
characterized in that said light-shielding film has a total thickness of 100 nm or less, 70% or more of which is accounted for by the thickness of a chromium compound that has an optical density (OD) per unit thickness of 0.025 nm$^{-1}$ or less for light having a wavelength of 450 nm.

2. The photomask blank according to claim 1, characterized in that 70% or more of the total thickness of said light-shielding film is accounted for by the thickness of a chromium compound that has a chromium content of 50 atomic % or less in terms of atomic ratio.

3. The photomask blank according to claim 1, characterized in that said light-shielding film comprises a chromium-metal film having a chromium content of 50 atomic % or more in terms of atomic ratio and a first and a second chromium-compound film having a chromium content of 50 atomic % or less in terms of atomic ratio, and
said chromium-metal film is disposed between said first chromium-compound film and said second chromium-compound film.

4. The photomask blank according to claim 1, characterized in that said light-shielding film comprises a first and a second chromium-metal film having a chromium content of 50 atomic % or more in terms of atomic ratio and a first, a second and a third chromium-compound film having a chromium content of 50 atomic % or less in terms of atomic ratio, and
said first chromium-metal film is disposed between said first chromium-compound film and said second chromium-compound film, and said second chromium-metal film is disposed between said second chromium-compound film and said third chromium-compound film.

5. The photomask blank according to claim 1, characterized in that said light-shielding film has a reflectance of 30% or less for light having a wavelength of 250 nm to 270 nm.

6. The photomask blank according to claim 1, characterized in that the optical density (OD) of said light-shielding film is 2.5 to 3.5 for light having a wavelength of 193 nm.

7. The photomask blank according to claim 1, characterized in that the optical density (OD) of said light-shielding film is 2.5 to 3.5 for light having a wavelength of 248 nm.

8. The photomask blank according to claim 1, characterized in that said light-shielding film is a multilayer film that contains a stack of a plurality of layers having different optical characteristics, and the uppermost layer of the multilayer film has an extinction coefficient (k) of 1.0 to 1.5 for light having a wavelength of 193 nm.

9. The photomask blank according to claim 1, characterized in that said light-shielding film is a multilayer film that contains a stack of a plurality of layers having different optical characteristics, a primary constituent material of the uppermost layer of the multilayer film is chromium oxide, chromium nitride or chromium oxynitride, and the percentage contents (atomic %) of oxygen, nitrogen and carbon in the film at depths of 0.5 to 1.0 nm from the surface of said uppermost layer are related according to the oxygen content>nitrogen content>carbon content.

10. The photomask blank according to claim 1, characterized in that said light-shielding film is a multilayer film that contains a stack of a plurality of layers, and the uppermost layer of the multilayer film has a thickness of 10 to 40 nm.

11. A half-tone phase-shift mask blank comprising:
a transparent substrate;
a translucent film having a predetermined phase-shift capability and a predetermined transmittance for exposure light formed on the transparent substrate; and
a light-shielding film formed on the translucent film, characterized in that said translucent film has a region that contains both silicon (Si) and molybdenum (Mo), and said light-shielding film has a thickness of 60 nm or less, 70% or more of which is accounted for by the thickness of a chromium compound that has an optical density (OD) per unit thickness of 0.025 nm$^{-1}$ or less for light having a wavelength of 450 nm.

12. The photomask blank according to claim 11, characterized in that 70% or more of the total thickness of said light-shielding film is accounted for by the thickness of a chromium compound that has a chromium content of 50 atomic % or less in terms of atomic ratio.

13. The photomask blank according to claim 11, characterized in that said light-shielding film comprises a chromium-metal film having a chromium content of 50 atomic % or more in terms of atomic ratio and a first and a second chromium-compound film having a chromium content of 50 atomic % or less in terms of atomic ratio, and said chromium-metal film is disposed between said first chromium-compound film and said second chromium-compound film.

14. The photomask blank according to claim 11, characterized in that said light-shielding film comprises a first and a second chromium-metal film having a chromium content of 50 atomic % or more in terms of atomic ratio and a first, a second and a third chromium-compound film having a chromium content of 50 atomic % or less in terms of atomic ratio, and said first chromium-metal film is disposed between said first chromium-compound film and said second chromium-compound film, and said second chromium-metal film is disposed between said second chromium-compound film and said third chromium-compound film.

15. The photomask blank according to claim 11, characterized in that said light-shielding film has a reflectance of 30% or less for light having a wavelength of 250 nm to 270 nm.

16. The photomask blank according to claim 11, characterized in that the optical density (OD) of said light-shielding film is 2.5 to 3.5 for light having a wavelength of 193 nm.

17. The photomask blank according to claim 11, characterized in that the optical density (OD) of said light-shielding film is 2.5 to 3.5 for light having a wavelength of 248 nm.

18. The photomask blank according to claim 11, characterized in that said light-shielding film is a multilayer film that contains a stack of a plurality of layers having different optical characteristics, and the uppermost layer of the multilayer film has an extinction coefficient (k) of 1.0 to 1.5 for light having a wavelength of 193 nm.

19. The photomask blank according to claim 11, characterized in that said light-shielding film is a multilayer film that contains a stack of a plurality of layers having different optical characteristics, a primary constituent material of the uppermost layer of the multilayer film is chromium oxide, chromium nitride or chromium oxynitride, and the percentage contents (atomic %) of oxygen, nitrogen and carbon in the film at depths of 0.5 to 1.0 nm from the surface of said uppermost layer are related according to the oxygen content>nitrogen content>carbon content.

20. The photomask blank according to claim 11, characterized in that said light-shielding film is a multilayer film that contains a stack of a plurality of layers, and the uppermost layer of the multilayer film has a thickness of 10 to 30 nm.

* * * * *